(12) United States Patent
Nishiwaki et al.

(10) Patent No.: US 9,379,216 B2
(45) Date of Patent: Jun. 28, 2016

(54) SEMICONDUCTOR DEVICE AND METHOD FOR MANUFACTURING SAME

(71) Applicant: Kabushiki Kaisha Toshiba, Minato-ku, Tokyo (JP)

(72) Inventors: Tatsuya Nishiwaki, Hyogo-ken (JP); Yoshitaka Hokomoto, Hyogo-ken (JP); Masatoshi Arai, Ishikawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 76 days.

(21) Appl. No.: 14/160,078

(22) Filed: Jan. 21, 2014

(65) Prior Publication Data

US 2014/0284708 A1    Sep. 25, 2014

(30) Foreign Application Priority Data

Mar. 19, 2013  (JP) .................................. 2013-057254
Nov. 8, 2013   (JP) .................................. 2013-232324

(51) Int. Cl.

| H01L 29/78 | (2006.01) |
|---|---|
| H01L 29/66 | (2006.01) |
| H01L 29/423 | (2006.01) |
| H01L 29/40 | (2006.01) |
| H01L 29/08 | (2006.01) |
| H01L 29/10 | (2006.01) |

(52) U.S. Cl.
CPC .... H01L 29/66719 (2013.01); H01L 29/66727 (2013.01); H01L 29/66734 (2013.01); H01L 29/7813 (2013.01); H01L 29/0869 (2013.01); H01L 29/1095 (2013.01); H01L 29/407 (2013.01); H01L 29/4236 (2013.01)

(58) Field of Classification Search
CPC .................................................. H01L 29/7813
See application file for complete search history.

(56) References Cited

U.S. PATENT DOCUMENTS

| 6,858,896 B2 | 2/2005 | Inagawa et al. |
|---|---|---|
| 6,921,939 B2 | 7/2005 | Zeng |
| 7,172,941 B2 | 2/2007 | Inagawa et al. |
| 7,361,557 B2 | 4/2008 | Inagawa et al. |
| 7,501,323 B2 | 3/2009 | Zeng |
| 7,585,732 B2 | 9/2009 | Inagawa et al. |

(Continued)

FOREIGN PATENT DOCUMENTS

| JP | 2002-368220 A | 12/2002 |
|---|---|---|
| JP | 2007-281512 A | 10/2007 |

(Continued)

*Primary Examiner* — Peniel M Gumedzoe
*Assistant Examiner* — Christopher Johnson
(74) *Attorney, Agent, or Firm* — White & Case LLP

(57) ABSTRACT

According to an embodiment, a method for manufacturing a semiconductor device includes forming a gate trench extending into a first semiconductor layer; forming a gate insulating film on an internal wall of the gate trench; forming a polysilicon in the gate trench; etching the polysilicon into the gate trench; forming an interlayer insulating film on the polysilicon; etching the first semiconductor layer so as to project the interlayer insulating film from the first semiconductor layer; forming a second semiconductor layer on the first semiconductor layer; forming a third semiconductor layer on the second semiconductor layer; forming a sidewall contacting a side face of the interlayer insulating film; forming a fourth semiconductor layer of the second conductivity type in the second semiconductor layer; and forming a first electrode electrically connected to the third semiconductor layer and the fourth semiconductor layer.

9 Claims, 18 Drawing Sheets

(56) References Cited

U.S. PATENT DOCUMENTS

| | | |
|---|---|---|
| 7,595,524 B2 | 9/2009 | Herrick et al. |
| 7,843,001 B2 | 11/2010 | Inagawa et al. |
| 7,867,852 B2 | 1/2011 | Hebert |
| 7,872,308 B2 | 1/2011 | Akiyama et al. |
| 7,910,990 B2 | 3/2011 | Inagawa et al. |
| 8,148,224 B2 | 4/2012 | Inagawa et al. |
| 8,168,498 B2 | 5/2012 | Inagawa et al. |
| 8,193,579 B2 | 6/2012 | Yoshimochi |
| 8,278,708 B2 | 10/2012 | Inagawa et al. |
| 8,377,775 B2 | 2/2013 | Inagawa et al. |
| 8,384,152 B2 | 2/2013 | Nakagawa et al. |
| 2002/0115257 A1 | 8/2002 | Inagawa et al. |
| 2005/0082609 A1 | 4/2005 | Inagawa et al. |
| 2006/0267090 A1* | 11/2006 | Sapp .................. H01L 29/7827 257/341 |
| 2007/0117329 A1 | 5/2007 | Inagawa et al. |
| 2008/0153235 A1 | 6/2008 | Inagawa et al. |
| 2008/0246081 A1 | 10/2008 | Li et al. |
| 2009/0146209 A1 | 6/2009 | Akiyama et al. |
| 2009/0218619 A1 | 9/2009 | Herbert et al. |
| 2009/0242973 A1 | 10/2009 | Herbert et al. |
| 2009/0294845 A1 | 12/2009 | Inagawa et al. |
| 2010/0320533 A1 | 12/2010 | Inagawa et al. |
| 2011/0059586 A1* | 3/2011 | Akiyama et al. .............. 438/270 |
| 2011/0076818 A1 | 3/2011 | Inagawa et al. |
| 2011/0156137 A1 | 6/2011 | Ikura |
| 2011/0254051 A1* | 10/2011 | Tsuzuki et al. ............... 257/140 |
| 2012/0015492 A1 | 1/2012 | Inagawa et al. |
| 2012/0139040 A1 | 6/2012 | Inagawa et al. |
| 2012/0142156 A1 | 6/2012 | Inagawa et al. |
| 2012/0214281 A1 | 8/2012 | Tomita et al. |
| 2013/0137223 A1 | 5/2013 | Inagawa et al. |
| 2014/0054682 A1* | 2/2014 | Padmanabhan et al. ...... 257/330 |

FOREIGN PATENT DOCUMENTS

| | | |
|---|---|---|
| JP | 2012-033951 A | 2/2012 |
| JP | 2012-199468 A | 10/2012 |

\* cited by examiner

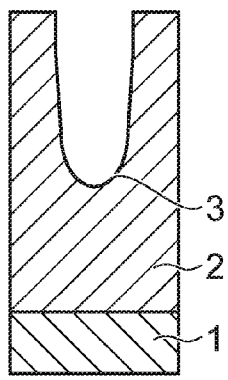
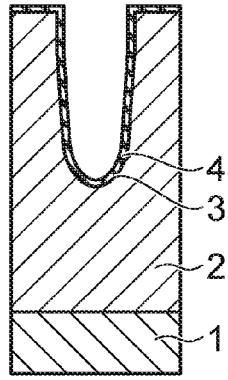
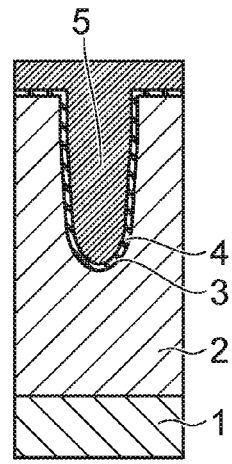
FIG. 3A  FIG. 3B  FIG. 3C
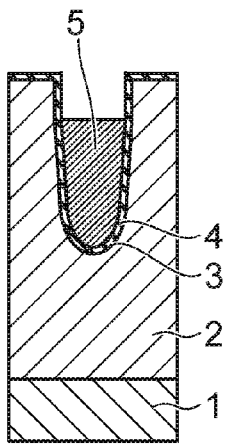
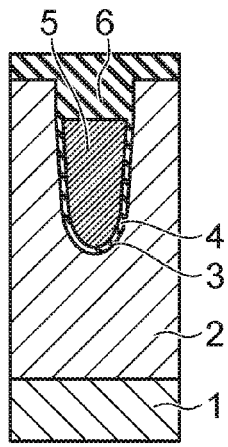
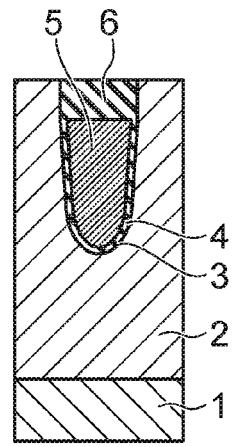
FIG. 3D  FIG. 3E  FIG. 3F

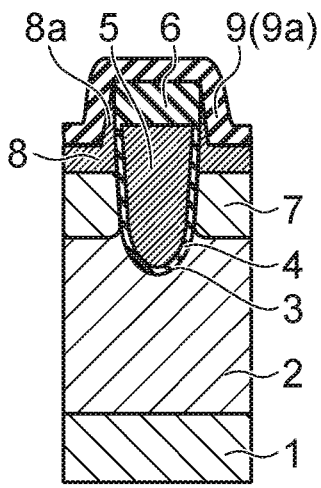
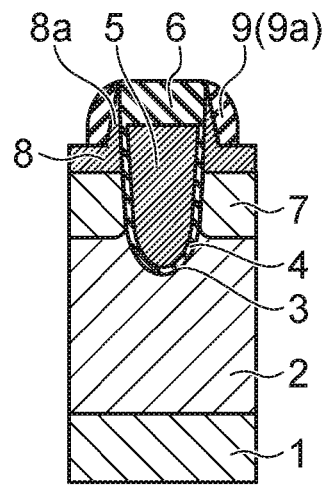
FIG. 7A    FIG. 7B
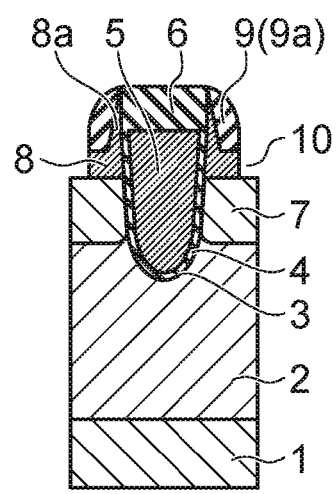
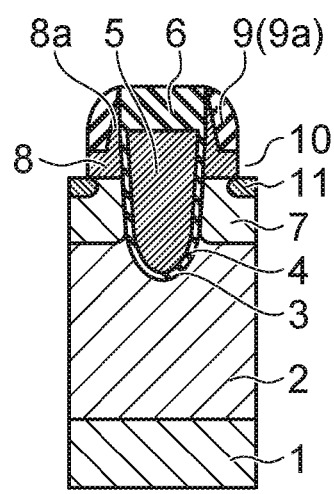
FIG. 7C    FIG. 7D

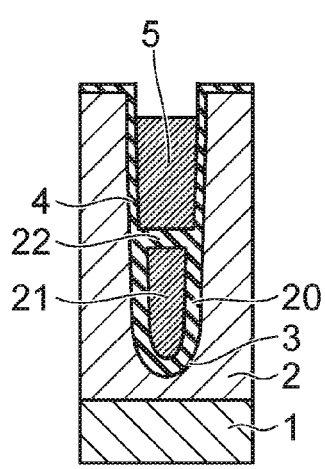
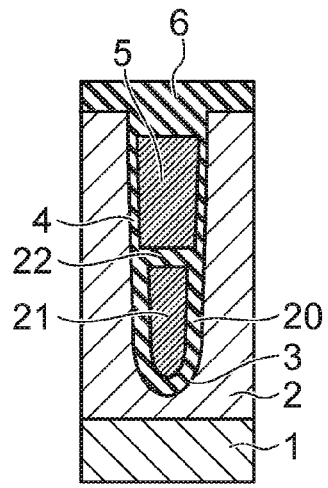
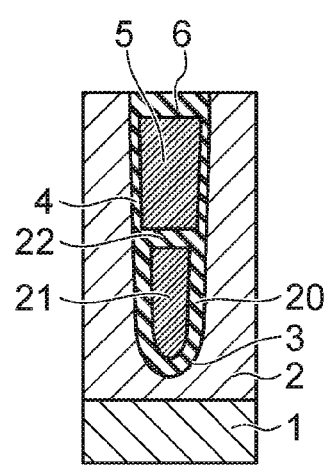
FIG. 21A    FIG. 21B    FIG. 21C
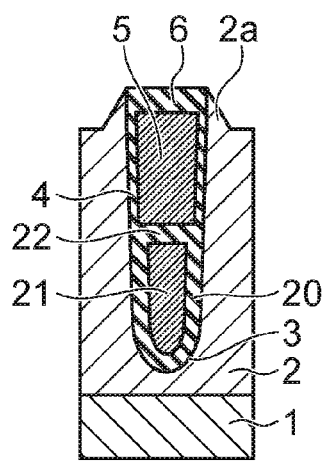
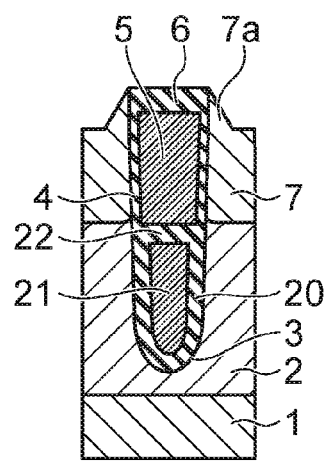
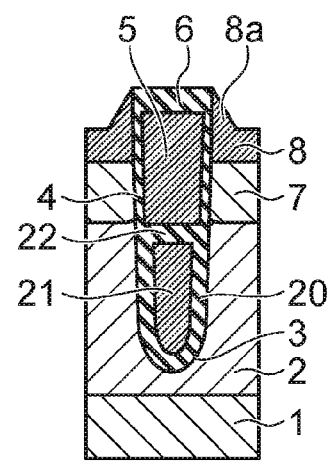
FIG. 21D    FIG. 21E    FIG. 21F

SEMICONDUCTOR DEVICE AND METHOD FOR MANUFACTURING SAME

CROSS-REFERENCE TO RELATED APPLICATIONS

This application is based upon and claims the benefit of priority from Japanese Patent Application No. 2013-057254, filed on Mar. 19, 2013 and Japanese Application No. 2013-232324, filed on Nov. 8, 2013; the entire contents of which are incorporated herein by reference.

FIELD

Embodiments described herein relate generally to a semiconductor device and a method for manufacturing the same.

BACKGROUND

A semiconductor element having an insulated gate is used for constituting a power semiconductor device. The power semiconductor device is required to have lower on-resistance in order to save power. For reducing the on-resistance thereof, it is advantageous to make a distance narrower between the periodically arranged semiconductor elements (i.e. unit cells), and thereby to increase the density of channels.

The planar gate and the trench gate are known as the insulated gate structures. A semiconductor device having the trench gate structure may be formed with the narrower distance between the unit cells than a semiconductor device having the planar gate structure, and may increase the channel density. Thus, the trench gate structure is often used for the power semiconductor device to reduce the on-resistance.

As progressing miniaturization of the device size, a mask alignment becomes more difficult in an n-channel transistor, for example, in a process of selectively forming an n$^+$-type source layer on a p-type base layer. Thus, a trench contact structure is used for manufacturing the n-channel transistor, since it is possible to eliminate the mask alignment in the process of forming the n$^+$-type source layer. The trench contact structure is used in a portion, where a source electrode contacts the n$^+$-type source layer and the p-type base layer. The source electrode is embedded in a contact trench extending through the n$^+$-type source layer to the p-type base layer, and electrically connected to the n$^+$-type source layer and the p-type base layer.

Furthermore, a p$^+$-type contact layer is provided in the bottom of the contact trench so that the source electrode is electrically connected to the p-type base layer therethrough, and thereby, a resistance of hole ejection from the p-type base layer to the source electrode is reduced. However, a mask alignment of forming the contact trench may cause variation in a distance between the gate trench and the p$^+$-type contact layer. As the p$^+$-type contact layer comes closer to the gate, the gate threshold voltage for forming inversion channel becomes higher. As a result, the on-resistance may increase depending on accuracy of the mask alignment.

BRIEF DESCRIPTION OF THE DRAWINGS

FIGS. 3A to 4F are cross-sectional views illustrating part of the manufacturing process of the semiconductor device according to the first embodiment;

FIGS. 7A to 7D are cross-sectional views illustrating part of a manufacturing process of the semiconductor device according to the third embodiment;

FIGS. 20A to 22C are sectional views illustrating part of the manufacturing process of the semiconductor device according to the seventh embodiment.

DETAILED DESCRIPTION

According to an embodiment, a method for manufacturing a semiconductor device, includes forming a gate trench extending into a first semiconductor layer of a first conductivity type; forming a gate insulating film on an internal wall of the gate trench; forming a polysilicon in the gate trench via the gate insulating film; etching the polysilicon into the gate trench; forming an interlayer insulating film on the polysilicon and on the first semiconductor layer; etching the interlayer insulating film until the first semiconductor layer is exposed; etching the first semiconductor layer so as to project the interlayer insulating film from the first semiconductor layer; forming a second semiconductor layer of a second conductivity type on the first semiconductor layer; forming a third semiconductor layer of the first conductivity type on the second semiconductor layer; forming a sidewall adjacent to the interlayer insulating film; forming a fourth semiconductor layer of the second conductivity type in the second semiconductor layer using the sidewall as a mask; forming a first electrode electrically connected to the third semiconductor layer and the fourth semiconductor layer; and forming a second electrode electrically connected to the first semiconductor layer.

Embodiments of the invention will now be described with reference to the drawings. The drawings are schematic ones used for easily understanding the embodiments. The shape, dimension, size relation and the like of components in the figures are not necessarily identical to those in practical application, and can be appropriately modified as long as the advantages of the invention are achieved. In the following description, the first conductivity type is p-type, and the second conductivity type is n-type. Alternatively, these conductivity types may be replaced with each other. In the following description, although regarding the semiconductor as silicon, for example, compound semiconductors such as silicon carbide (SiC) and nitride semiconductors (GaN, AlGaN) may be used in the embodiments. In the case where the n-type conductivity is denoted by $n^+$, n, and $n^-$, it is assumed that the n-type impurity concentration is decreased in this order. Also for p-type, similarly, it is assumed that the p-type impurity concentration is decreased in the order of $p^+$, p. The semiconductor devices described in the embodiments are MOSFETs (metal oxide silicon field effect transistors), but the embodiments are not limited thereto. For example, any semiconductor device having a trench gate structure such as IGBT (insulated gate bipolar transistor) may be manufactured using the method according to the embodiments.

(First Embodiment)

Figure 1:
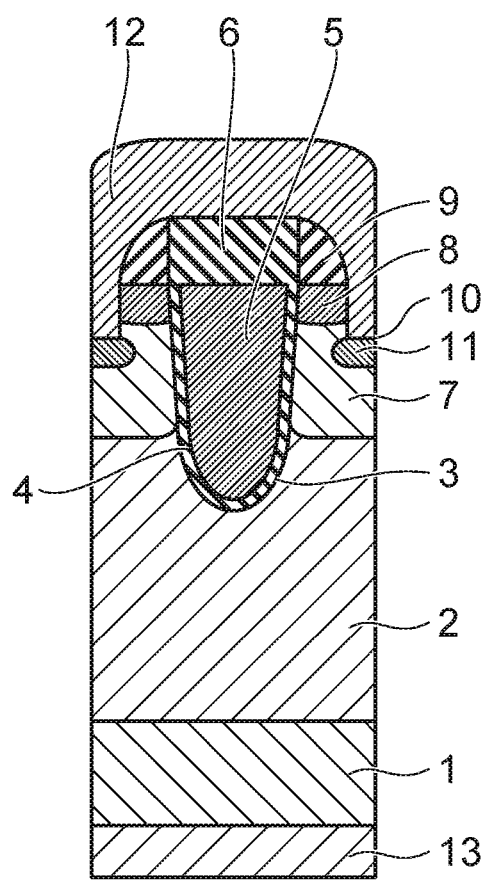
FIG. 1 is a cross-sectional view of a semiconductor device manufactured by a method according to a first embodiment.
Figure 2:
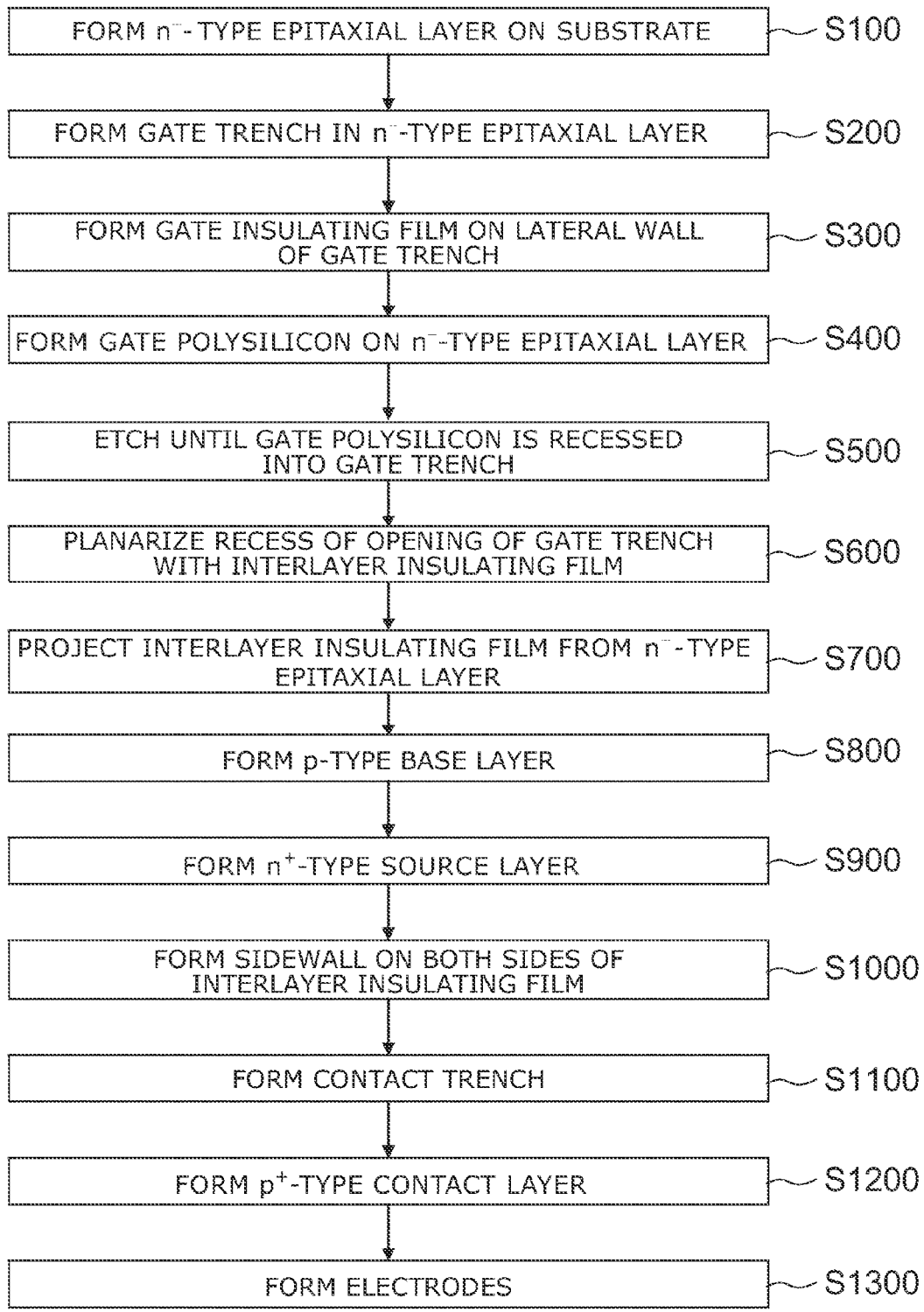
FIG. 2 is a flow chart of the manufacturing process of the semiconductor device based on the method according to the first embodiment.

With reference to FIGS. 1 to 4F, a method for manufacturing a semiconductor device according to a first embodiment of the invention is described. FIG. 1 is a cross-sectional view of a semiconductor device manufactured by the method according to the embodiment. FIG. 2 is a flow chart of the manufacturing process of the semiconductor device based on the method according to the embodiment. FIGS. 3A to 4F are cross-sectional views illustrating part of the manufacturing process of the semiconductor device according to the embodiment.

FIG. 1 shows a cross-sectional structure of a unit cell of the semiconductor device. As shown in FIG. 1, the semiconductor device includes an $n^+$-type semiconductor substrate 1, an $n^-$-type epitaxial layer 2 (first semiconductor layer of a first conductivity type), a p-type base layer 7 (second semiconductor layer of a second conductivity type), an $n^+$-type source layer 8 (third semiconductor layer of the first conductivity type), a gate insulating film 4, a gate electrode 5 (gate polysilicon), an interlayer insulating film 6, a sidewall 9, a $p^+$-type contact layer 11 (fourth semiconductor layer of the second conductivity type), a source electrode 12 (first electrode), and a drain electrode 13 (second electrode). The semiconductor is e.g. silicon.

The $n^-$-type epitaxial layer 2 is provided on the $n^+$-type semiconductor substrate 1 by epitaxial growth of silicon. The gate electrode 5 is provided via the gate insulating film 4 in a gate trench 3 extending from the surface of the $n^-$-type epitaxial layer 2 into the $n^-$-type epitaxial layer 2. The gate insulating film 4 is made of e.g. silicon oxide, but can also be made of silicon nitride or silicon oxynitride. The gate insulating film 4 is provided so as to cover the inner surface (internal wall and bottom) of the gate trench 3. The gate electrode 5 is made of polysilicon. The polysilicon that serves as the gate electrode 5 is hereinafter referred to as gate polysilicon.

The p-type base layer 7 is provided from the surface of the $n^-$-type epitaxial layer 2 into the $n^-$-type epitaxial layer 2 so as to be adjacent to the gate insulating film 4 provided in the gate trench 3. The $n^+$-type source layer 8 is provided from the surface of the p-type base layer 7 into the p-type base layer 7 so as to be adjacent to the gate insulating film 4 provided in the gate trench 3.

The interlayer insulating film 6 is provided on the gate electrode 5 and projected from the $n^+$-type source layer 8. The sidewall 9 is provided adjacent to the interlayer insulating film 6 on the $n^+$-type source layer 8. The interlayer insulating film 6 and the sidewall 9 are insulators, for example. The interlayer insulating film 6 may be made of the same insulating material as the sidewall 9, or may be made of different insulating material from the sidewall 9. The interlayer insulating film is made of e.g. silicon oxide, and may also be made of silicon oxynitride or silicon nitride.

A contact trench 10 is provided from the surface of the $n^+$-type source layer 8 into the p-type base layer 7. The internal wall of the contact trench 10 includes the $n^+$-type source layer 8 and the p-type base layer 7. The $p^+$-type contact layer 11 is provided in the p-type base layer 7 so as to be adjacent to the bottom of the contact trench 10.

The source electrode 12 is provided on the interlayer insulating film 6 and the sidewall 9 so as to fill the contact trench 10. The source electrode 12 is electrically connected to the $p^+$-type contact layer 11 at the bottom of the contact trench 10, and electrically connected to the $n^+$-type source layer 8 at the internal wall of the contact trench 10. The drain electrode 13 is provided on the $n^+$-type semiconductor substrate 1 on a side opposite to the $n^-$-type epitaxial layer 2. The drain electrode 13 is electrically connected to the $n^+$-type semiconductor substrate 1. The source electrode 12 and the drain electrode 13 are metals, and are made of e.g. aluminum or copper. The source electrode 12 may have a stacked structure of Ti (titanium)/TiN (titanium nitride)/W (tungsten)/Al (aluminum), so as to be well embedded in the contact trench.

Next, the method for manufacturing a semiconductor device according to the embodiment is described with reference to FIGS. 2 to 4F. As shown in FIG. 2, the method includes the steps of forming an $n^-$-type epitaxial layer on an $n^+$-type semiconductor substrate (S100), forming a gate trench in the $n^-$-type epitaxial layer (S200), forming a gate insulating film on the internal wall of the gate trench (S300), forming a gate polysilicon in the gate trench and on the $n^-$-type epitaxial layer (S400), etching the gate polysilicon so as to remove a portion on the $n^-$-type epitaxial layer, and so as to form a recess on the opening side of the gate trench, leaving a portion thereof embedded in the gate trench (S500), planarizing the recess with an interlayer insulating film (S600), projecting the interlayer insulating film on the gate polysilicon from the $n^-$-type epitaxial layer (S700), forming a p-type base layer (S800), forming an $n^+$-type source layer (S900), forming a sidewall on both sides of the interlayer insulating film (S1000), forming a contact trench (S1100), forming a $p^+$-type contact layer (S1200), and forming electrodes (S1300).

These steps will be described with reference to FIGS. 3A to 4F. As shown in FIG. 3A, an $n^-$-type epitaxial layer 2 is formed on an $n^+$-type semiconductor substrate 1 by epitaxial growth of silicon using e.g. CVD (chemical vapor deposition) technique (S100). Then, a gate trench 3 is formed using e.g. RIE (reactive ion etching), so as to extend into the $n^-$-type epitaxial layer 2 from the surface thereof (S200).

Next, as shown in FIG. 3B, a gate insulating film is formed on the internal wall of the gate trench (S300). A gate insulating film 4 is formed so as to cover the inner surface (internal wall and bottom) of the gate trench 3 and the surface of the $n^-$-type epitaxial layer 2. The gate insulating film 4 is made of e.g. silicon oxide formed by thermally oxidizing the $n^-$-type epitaxial layer 2. However, the gate insulating film 4 is not limited thereto. The gate insulating film 4 may also be made of silicon oxide, silicon nitride, or silicon oxynitride formed by CVD technique and the like.

Next, as shown in FIG. 3C, a gate polysilicon is formed on the n⁻-type epitaxial layer 2 (S400). A gate polysilicon 5 is formed on the n⁻-type epitaxial layer 2 so as to be embedded in the gate trench 3 via the gate insulating film 4 by e.g. CVD technique. The gate polysilicon 5 has conductivity, and either n-type or p-type polysilicon is available.

Next, as shown in FIG. 3D, the gate polysilicon is removed by etching, so as to be recessed into the gate trench (S500). The surface of the gate polysilicon 5 is etched by RIE. Thus, the gate polysilicon on the n⁻-type epitaxial layer 2 is removed so that the gate polysilicon 5 is recessed into the gate trench 3. That is, the gate polysilicon 5 is etched so that an upper surface of the gate polysilicon 5 is located on the n⁺-type semiconductor substrate 1 side from the upper surface of the n⁻-type epitaxial layer 2.

Figure 4A:
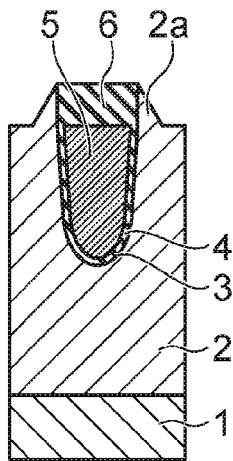

Next, as shown in FIGS. 3E and 3F, the recess on the opening side of the gate trench is planarized with an interlayer insulating film 6 (S600). An interlayer insulating film 6 is formed using e.g. CVD method on the n⁻-type epitaxial layer 2 so as to fill the recess. The interlayer insulating film 6 is made of e.g. silicon oxide. Alternatively, silicon nitride or silicon oxynitride may also be used for the interlayer insulating film 6. The interlayer insulating film 6 is etched using RIE until part of the n⁻-type epitaxial layer 2 is exposed. As a result, the interlayer insulating film 6 is embedded in the recess on the gate electrode 5 provided in the gate trench 3, so as to planarize the surfaces of the n⁻-type epitaxial layer 2 and the interlayer insulating film 6. Next, as shown in FIG. 4A, the interlayer insulating film 6 is formed so as to project from the n⁻-type epitaxial layer (S700). The surface of the n⁻-type epitaxial layer 2 is etched back by RIE. Thus, the surface of the n⁻-type epitaxial layer 2 is set back to the position of e.g. the upper end of the gate electrode 5. At this time, the etching condition of RIE may be adjusted so that the n⁻-type epitaxial layer 2 remains without being etched away in the portion adjacent to the interlayer insulating film 6. As a result, the remaining portion 2a of the n⁻-type epitaxial layer 2 is formed on both sides of the interlayer insulating film 6, having a tapered shape. This etching may also be performed using CDE (chemical dry etching).

Figure 4B:
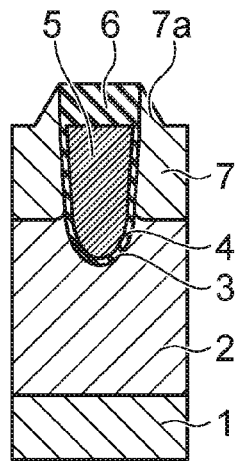

Next, as shown in FIG. 4B, a p-type base layer 7 is formed on the n⁻-type epitaxial layer 2 (S800). P-type impurities are implanted using ion implantation technique from the surface of the n⁻-type epitaxial layer 2 and the surface of the remaining portion 2a into the n⁻-type epitaxial layer 2. Then, the p-type impurity is diffused and activated by heat treatment in the n⁻-type epitaxial layer 2. As a result, a p-type base layer 7 is formed on the n⁻-type epitaxial layer 2, and adjacent to the gate insulating film 4. The diffusion of the p-type impurity is controlled so that the bottom of the p-type base layer 7 does not extend to the n⁺-type semiconductor substrate 1 side beyond the lower end level of the gate electrode 5. The remaining portion 2a of the n⁻-type epitaxial layer is similarly changed to a p-type base layer 7a.

Figure 4C:
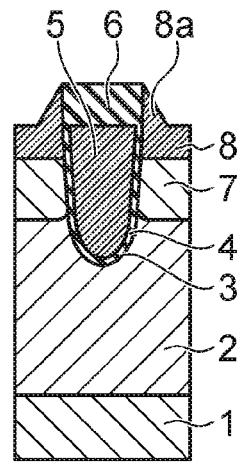

Next, as shown in FIG. 4C, an n⁺-type source layer 8 is formed on the p-type base layer 7 (S900). N-type impurities are implanted using ion implantation technique from the surface of the p-type base layer 7 and the surface of the p-type base layer 7a into the p-type base layer 7. Then, the n-type impurity is diffused and activated by heat treatment in the p-type base layer 7. As a result, the n⁺-type source layer 8 is formed on the p-type base layer 7 and adjacent to the gate insulating film 4. The p-type base layer 7a is similarly changed to an n⁺-type source layer 8a.

Figure 4D:
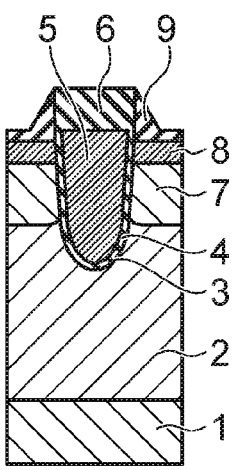
Figure 4E:
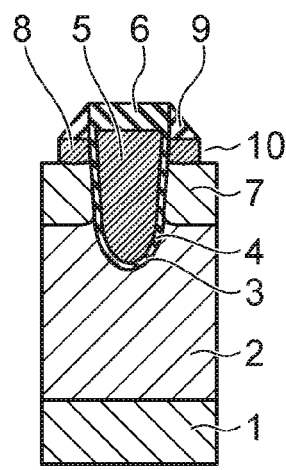

Next, as shown in FIGS. 4D and 4E, sidewalls 9 are formed on both sides of the interlayer insulating film 6 (S1000). An insulating film 9 of silicon oxide is formed by thermally oxidizing the surface of the n⁺-type source layer 8 and the n⁺-type source layer 8a so that the insulating film 9 contacts the interlayer insulating film 6, and covers the n⁺-type source layer 8. A portion of the insulating film 9 formed from the n⁺-type source layer 8a becomes thicker in the direction perpendicular to the surface of the n⁺-type source layer 8 than other portion of the insulating film 9 formed on the n⁺-type source layer 8. Then, the insulating film 9 is etched using RIE until part of the n⁺-type source layer 8 is exposed. Then, the portion of the insulating film 9 formed from the n⁺-type source layer 8a remains as a sidewall 9. As a result, the sidewalls 9 are formed on both sides of the interlayer insulating film 6.

Figure 4F:
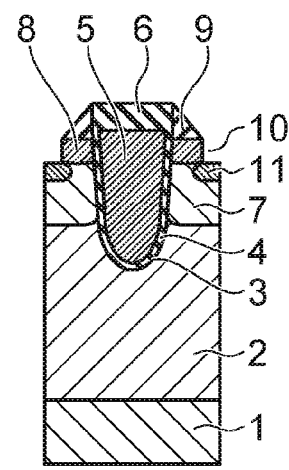

Next, a contact trench 10 is formed as shown in FIG. 4F (S1100). Exposed surfaces of the n⁺-type source layer 8 are etched by RIE using sidewalls 9 as a mask. When the bottom of the contact trench 10 reaches the p-type base layer 7, etching by RIE is stopped. Thus, a contact trench 10 is formed piercing the n⁺-type source layer 8. As a result, the internal wall of the contact trench 10 is formed along the side surface of the sidewall 9. The internal wall of the contact trench 10 includes the n⁺-type source layer 8, and the bottom of the contact trench 10 is a surface of the p-type base layer 7.

Next, as shown in FIG. 4F, a p⁺-type contact layer is formed in the bottom of the contact trench 10 (S1200). P-type impurities are ion implanted using the sidewall 9 as a mask into the p-type base layer 7 exposed at the bottom of the contact trench 10. Then, the p-type impurities are diffused and activated by heat treatment in the p-type base layer 7. Thus, a p⁺-type contact layer 11 is formed in the p-type base layer 7 so as to be adjacent to the bottom of the contact trench 10.

Next, a source electrode 12 is formed as shown in FIG. 1 (S1300). The source electrode 12 is formed so as to fill the contact trench 10 and to cover the interlayer insulating film 6 and the sidewall 9. The source electrode 12 is electrically connected to the n⁺-type source layer 8 at the internal wall of the contact trench 10, and electrically connected to the p⁺-type contact layer 11 at the bottom of the contact trench 10. The source electrode 12 may have a stacked structure of Ti/TiN/W/Al provided in this order, for example. Thus, the source electrode 12 may be formed well filling the contact trench 10. A drain electrode 13 is formed on the n⁺-type semiconductor substrate 1 on the side opposite to the n⁻-type epitaxial layer 2. Thus, the drain electrode 13 is electrically connected to the n⁺-type semiconductor substrate 1.

The method for manufacturing a semiconductor device according to this embodiment includes the step of forming a contact trench 10 (S1100). Furthermore, the method includes the step of forming a p⁺-type contact layer 11 in the p-type base layer so as to be adjacent to the bottom of the contact trench 10 (S1200). The p⁺-type contact layer 11 is a diffusion layer of p-type impurity. Thus, the p⁺-type contact layer 11 may spread from the bottom of the contact trench 10 toward the gate trench 3. In this context, the p⁺-type contact layer 11 is formed to be sufficiently away from the gate insulating film 4 formed on the internal wall of the gate trench 3 so that an inversion channel is formed in the p-type base layer 7 between the p⁺-type contact layer 11 and the gate insulating film 4.

When the p⁺-type contact layer 11 comes close to the gate insulating film 4 to the extent of affecting the formation of the inversion channel in the p-type base layer 7, the threshold gate voltage may increases for generating the inversion channel.

This decreases the electron density of the channel layer and increases the on-resistance of the semiconductor device. Thus, the accuracy of mask alignment in the lithography for forming a contact trench becomes significant as the miniaturization of the device advances. When the contact trench 10 comes closer to the gate trench 3 depending on accuracy of the mask alignment, the threshold gate voltage increases and thereby the on-resistance of the semiconductor device increases.

In the method for manufacturing a semiconductor device according to the embodiment, the sidewalls 9 formed on both sides of the interlayer insulating film 6 are used as a mask for etching the contact trench 10. As described below, the sidewalls 9 are formed in a self-aligned manner without mask alignment. Thus, the dimensional variation is smaller than a method using mask alignment.

In the method according to the embodiment, the interlayer insulating film 6 is formed projecting from the n$^-$-type epitaxial layer in the step S700. Then, the sidewalls are formed on both sides of the interlayer insulating film in the step S1000. Here, the insulating film 9 is formed so as to extend from the interlayer insulating film 6 projected from the n$^-$-type epitaxial layer 2 and to cover the n$^-$-type epitaxial layer 2. The remaining portion 2a of the n$^-$-type epitaxial layer 2 is thermally oxidized on both sides of the interlayer insulating film 6, and makes the insulating film 9 thicker than a portion formed on the n$^-$-type epitaxial layer 2. Accordingly, the insulating film 9 formed from the remaining portion 2a remains as a sidewall 9, after the entire surface of the insulating film 9 is etched by RIE.

The remaining portion 2a is formed on both sides of the interlayer insulating film 6 under the adjusted condition of RIE in the step S700. The sidewalls 9 are formed using RIE in a self-aligned manner without an etching mask. Thus, the dimensional variation becomes smaller than that in the case of using an etching mask.

As described above, using the method for manufacturing a semiconductor device according to the embodiment, a trench gate semiconductor device may be manufactured under suppressing influence of the dimensional variation exerted on the on-resistance.

(Second Embodiment)

A method for manufacturing a semiconductor device according to a second embodiment will now be described with reference to FIGS. 5A to 5F. FIGS. 5A to 5F are cross-sectional views illustrating part of a manufacturing process based on the method according to this embodiment. A flow chart of the manufacturing process based on the manufacturing method according to the embodiment is similar to that of the first embodiment. The same portions as those described in the first embodiment are labeled with like reference numerals or symbols, and the description thereof is omitted. The differences from the first embodiment are described.

Like the method for manufacturing a semiconductor device according to the first embodiment, as shown in FIGS. 3A to 3F, the method for manufacturing a semiconductor device according to this embodiment also includes the steps of forming an n$^-$-type epitaxial layer on an n$^+$-type semiconductor substrate (S100), forming a gate trench in the n$^-$-type epitaxial layer (S200), forming a gate insulating film on the internal wall of the gate trench (S300), forming a gate polysilicon on the n$^-$-type epitaxial layer (S400), etching the gate polysilicon until a recess is formed in the gate trench (S500), and planarizing the recess on the opening side of the gate trench with an interlayer insulating film (S600).

Figure 5A:
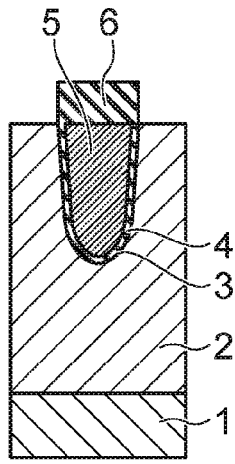
FIGS. 5A to 5F are cross-sectional views illustrating part of a manufacturing process of a semiconductor device according to a second embodiment.

Next, as shown in FIG. 5A, the interlayer insulating film 6 is formed so as to project from the n$^-$-type epitaxial layer (S700). The n$^-$-type epitaxial layer 2 is etched by RIE. Thus, the surface of the n$^-$-type epitaxial layer 2 is set back to the position of e.g. the upper end of the gate electrode 5. The method according to this embodiment is different from the method according to the first embodiment in that the n$^-$-type epitaxial layer 2 is etched without leaving the remaining portion 2a on both sides of the interlayer insulating film 6.

Figure 5B:
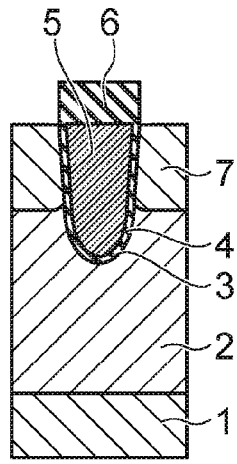
Figure 5C:
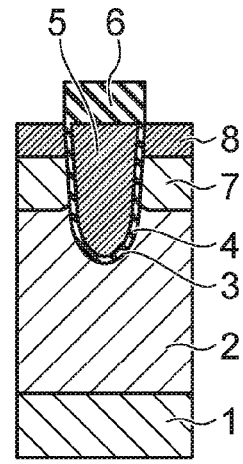

Next, as shown in FIGS. 5B and 5C, like the method according to the first embodiment, the steps of forming a p-type base layer (S800) and forming an n$^+$-type source layer (S900) are performed.

Figure 5D:
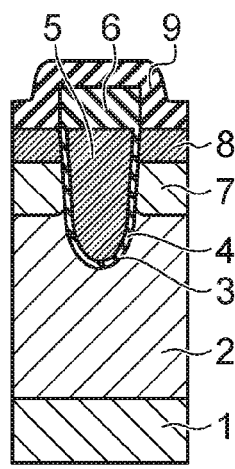
Figure 5E:
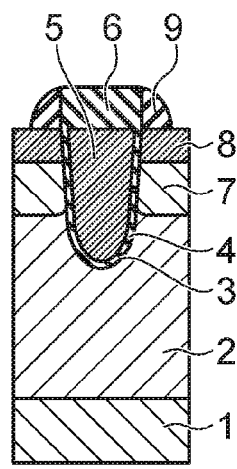

Next, as shown in FIGS. 5D and 5E, sidewalls 9 are formed on both sides of the interlayer insulating film (S1000). As shown in FIG. 5D, an insulating film 9 is formed using e.g. CVD technique so as to cover the upper surface and side surface of the interlayer insulating film 6 and the surface of the n$^+$-type source layer 8. The insulating film 9 is made of e.g. silicon oxide extending from the interlayer insulating film 6 and covering the surface of the n$^+$-type source layer 8. The insulating film 9 may also be silicon nitride or silicon oxynitride instead of silicon oxide.

Also in the method according to this embodiment, a portion of the insulating film 9 formed on the side surface of the interlayer insulating film 6 is thicker than a portion of the insulating film 9 formed on the n$^+$-type source layer 8 by the amount of the height of the interlayer insulating film 6 projected from the surface of the n$^+$-type source layer 8. As shown in FIG. 5E, the insulating film 9 is etched using RIE until the surface of the n$^+$-type source layer 8 is exposed in the insulating film 9. Thus, the portion of the insulating film 9 formed on the side surface of the interlayer insulating film 6 remains as a sidewall 9. That is, the sidewalls 9 are formed on both sides of the interlayer insulating film 6 in a self-aligned manner.

A width of the sidewall 9 in the direction parallel to the surface of the n$^+$-type source layer 8 is generally equal to the thickness of the insulating film 9 formed using CVD technique. That is, a variation in the width of the sidewall 9 is a thickness variation of film formed using CVD technique, and may be far smaller than a variation of mask alignment in lithography.

Figure 5F:
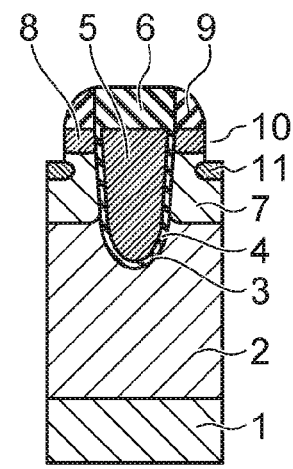

Next, as shown in FIG. 5F, the steps of forming a contact trench (S1100) and forming a p$^+$-type contact layer (S1200) are performed. Then, as shown in FIG. 1, like the method according to the first embodiment, the step of forming electrodes (S1300) is performed.

Also in the method according to this embodiment, the sidewalls 9 formed on both sides of the interlayer insulating film 6 are used as a mask for forming a contact trench 10.

In the method according to this embodiment, the step of projecting the interlayer insulating film from the n$^-$-type epitaxial layer (S700) is performed. Then, the step of forming a sidewall on both sides of the interlayer insulating film (S1000) is performed. Here, the insulating film 9 is formed so as to extend from the interlayer insulating film 6 projected from the n$^-$-type epitaxial layer 2 and to cover the surface of the n$^-$-type epitaxial layer 2. The portion of the insulating film 9 formed on the side surface of the interlayer insulating film 6 is thicker than the portion of the insulating film 9 formed on the surface of the n$^+$-type source layer 8 by the amount of the height of the interlayer insulating film 6 projected from the surface of the n$^+$-type source layer 8. The insulating film 9 is etched by RIE until part of the n$^+$-type source layer 8 is exposed. Thus, the portion of the insulating film 9 formed on the side surface of the interlayer insulating film 6 remains as a sidewall 9.

As described above, the sidewall 9 is formed in a self-aligned manner without mask alignment. Thus, the dimensional variation is smaller than that in mask alignment. Also by the method according to this embodiment, a trench gate semiconductor device may be manufactured under suppressing the influence of the dimensional variation exerted on the on-resistance.

Furthermore, in the method for manufacturing a semiconductor device according to this embodiment, the n⁻-type epitaxial layer 2 is etched using RIE in the step of projecting the interlayer insulating film 6 from the n⁻-type epitaxial layer (S700). Thus, the surface of the n⁻-type epitaxial layer 2 is set back to the position of e.g. the upper end of the gate electrode 5. However, the embodiment is not limited thereto. The n⁻-type epitaxial layer 2 may be etched so that the surface of the n⁻-type epitaxial layer 2 is located on the n⁺-type semiconductor substrate side from the upper end of the gate electrode 5. That is, the upper end of the gate electrode 5 may be projected from the surface of the n⁻-type epitaxial layer 2.

As a result, the upper end of the gate electrode 5 is projected from the n⁺-type source layer 8. The area of the gate insulating film 4 sandwiched between the gate electrode 5 and the n⁺-type source layer 8 is not affected by the amount of projection on the upper end side of the gate electrode 5. That is, the area of the gate insulating film 4 sandwiched between the gate electrode 5 and the n⁺-type source layer 8 is not affected by the amount of etching of the gate polysilicon 5 in the step of etching the gate polysilicon (S500). Thus, in the method according to this embodiment, the gate-source parasitic capacitance is not affected by the amount of etching of the gate polysilicon 5. Accordingly, the manufacturing variation of the gate-source parasitic capacitance is small.

(Third Embodiment)

Figure 6:
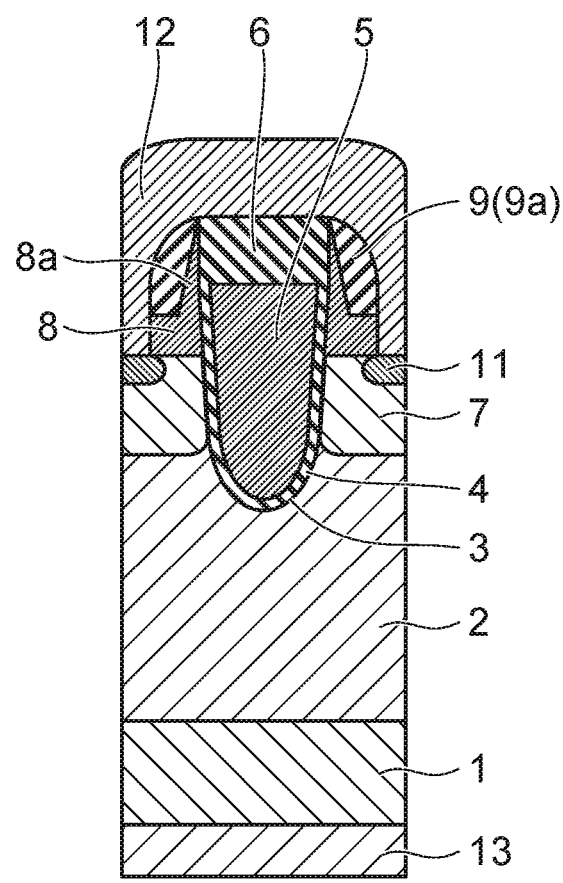
FIG. 6 is a cross-sectional view of a semiconductor device manufactured by a method according to a third embodiment.

A method for manufacturing a semiconductor device according to a third embodiment will now be described with reference to FIGS. 6 to 7D. FIG. 6 is a cross-sectional view of a semiconductor device manufactured by the method according to the third embodiment. FIGS. 7A to 7D are cross-sectional views illustrating part of the manufacturing process based on the method according to this embodiment. A flow chart of the manufacturing process based on the method according to this embodiment is similar to the flow chart of the method according to the first embodiment. The same portions as those described in the first embodiment are labeled with like reference numerals or symbols, and the description thereof is omitted. The differences from the first embodiment are described.

As shown in FIG. 6, the semiconductor device manufactured by the method for manufacturing a semiconductor device according to this embodiment includes part 8a of the n⁺-type source layer 8 between the interlayer insulating film 6 and the sidewall 9. The part 8a of the n⁺-type source layer 8 is a portion turned to the n⁺-type source layer 8 by diffusing n-type impurity into the remaining portion 2a of the n⁻-type epitaxial layer 2. In the following, the manufacturing process based on the method according to this embodiment is described.

As shown in FIGS. 3A to 4C, the method for manufacturing a semiconductor device according to this embodiment includes the steps of forming an n⁻-type epitaxial layer on an n⁺-type semiconductor substrate (S100), forming a gate trench in the n⁻-type epitaxial layer (S200), forming a gate insulating film on the lateral wall of the gate trench (S300), forming a gate polysilicon on the n⁻-type epitaxial layer (S400), etching the gate polysilicon until a recess is formed in the gate trench (S500), planarizing the recess on the opening side of the gate trench with an interlayer insulating film (S600), projecting the interlayer insulating film from the n⁻-type epitaxial layer (S700), forming a p-type base layer (S800), and forming an n⁺-type source layer (S900).

Next, as shown in FIGS. 7A and 7B, the step of forming sidewalls on both sides of the interlayer insulating film 6 (S1000) is performed. As shown in FIG. 7A, an insulating film 9 is formed using e.g. CVD technique so as to cover the upper surface of the interlayer insulating film 6, the surface of the remaining portion n⁺-type source layer 8a, and the surface of the n⁺-type source layer 8. The insulating film 9 is made of e.g. silicon oxide extending from the interlayer insulating film 6 and covering the surface of the n⁺-type source layer 8. The insulating film 9 may also be silicon nitride or silicon oxynitride instead of silicon oxide.

Also in the method according to this embodiment, the portion of the insulating film 9 formed on the n⁺-type source layer 8a (remaining portion) on both sides of the interlayer insulating film 6 is thicker in the direction perpendicular to the surface of the n⁺-type source layer 8 than the portion of the insulating film 9 formed on the surface of the n⁺-type source layer 8, due to the inclination of the taper of the n⁺-type source layer 8a. From the surface of the insulating film 9, the insulating film 9 is etched using RIE until part of the n⁺-type source layer 8 is exposed. Thus, the portion of the insulating film 9 formed on the n⁺-type source layer 8a remains as a sidewall 9. That is, the sidewalls 9 are formed on both sides of the interlayer insulating film 6 in a self-aligned manner.

A width of the sidewall 9 in the direction parallel to the surface of the n⁺-type source layer 8 is determined by the film thickness of the insulating film 9 formed using CVD technique. That is, a variation in the width of the sidewall 9 is a thickness variation of film formed using CVD technique, and may be far smaller than a variation of mask alignment in lithography.

Furthermore, the width of the n⁺-type source layer 8a is determined by adjusting the etching condition of RIE in the step of projecting the interlayer insulating film 6 from the n⁻-type epitaxial layer (S700). Thus, a variation in the width of the n⁺-type source layer 8a may be far smaller than the variation of mask alignment.

In the later process, the width of the mask used for forming a contact trench 10 is the sum of the width of the sidewall 9 and the width of the n⁺-type source layer 8a. Thus, a variation in the width of the mask for forming a contact trench 10 may be far smaller than the variation of mask alignment.

Next, as shown in FIG. 7C, the step of forming a contact trench 10 (S1100) is performed. The contact trench 10 is formed using RIE along the sidewall 9. Thus, in this embodiment, the distance of the contact trench 10 spaced from the gate trench 3 depends not only on the width of the sidewall 9 in the direction parallel to the surface of the n⁺-type source layer 8, but also on the width of the remaining portion n⁺-type source layer 8a located between the sidewall 9 and the interlayer insulating film 6. That is, in the direction parallel to the surface of the n⁺-type source layer 8, the width of the mask used for etching the contact trench 10 is the sum of the width of the sidewall 9 and the width of the remaining portion n⁺-type source layer 8a.

Next, as shown in FIG. 7D, the step of forming a p⁺-type contact layer (S1200) is performed. Then, the step of forming electrodes (S1300) is performed to complete the device as shown in FIG. 1.

Also in the method for manufacturing a semiconductor device according to this embodiment, the sidewalls 9 formed on both sides of the interlayer insulating film 6 are used as the mask for forming a contact trench 10. As described above, the sidewalls 9 are formed on both sides of the interlayer insulating film 6 in a self-aligned manner. Thus, the dimensional variation is smaller than that in mask alignment.

Furthermore, in the method according to this embodiment, the $n^+$-type source layer 8a (remaining portion) located between the sidewall 9 and the interlayer insulating film 6 also serves as part of the mask. As described above, the $n^+$-type source layers 8a are also formed on both sides of the interlayer insulating film 6 in a self-aligned manner. Thus, the dimensional variation is smaller than that in mask alignment.

Thus, also by the method for manufacturing a semiconductor device according to this embodiment, a trench gate semiconductor device can be manufactured under suppressing influence of the dimensional variation exerted on the on-resistance.

(Fourth Embodiment)

Figure 8:
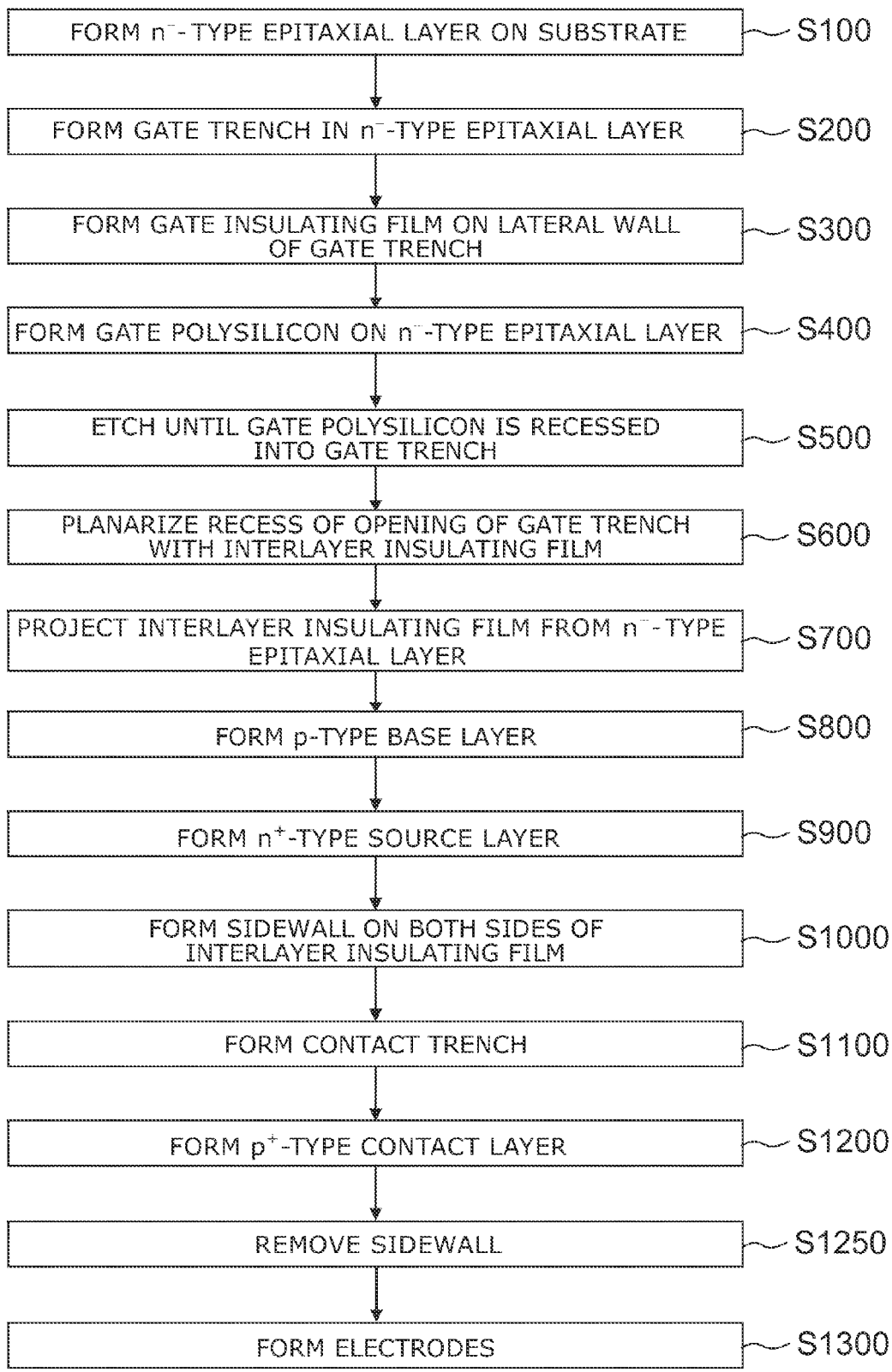
FIG. 8 is a flow chart of a manufacturing process of a semiconductor device based on a method according to a fourth embodiment.
Figure 9:
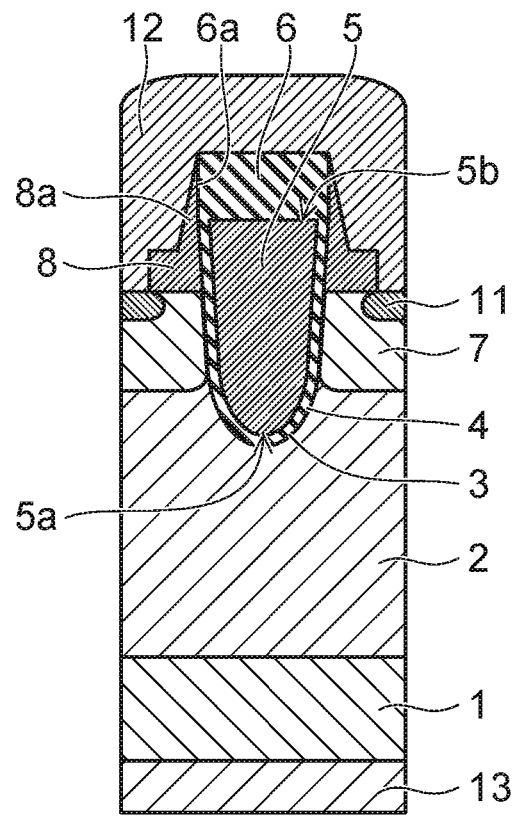
FIG. 9 is a cross-sectional view of the semiconductor device manufactured by the method according to the fourth embodiment.
Figure 10:
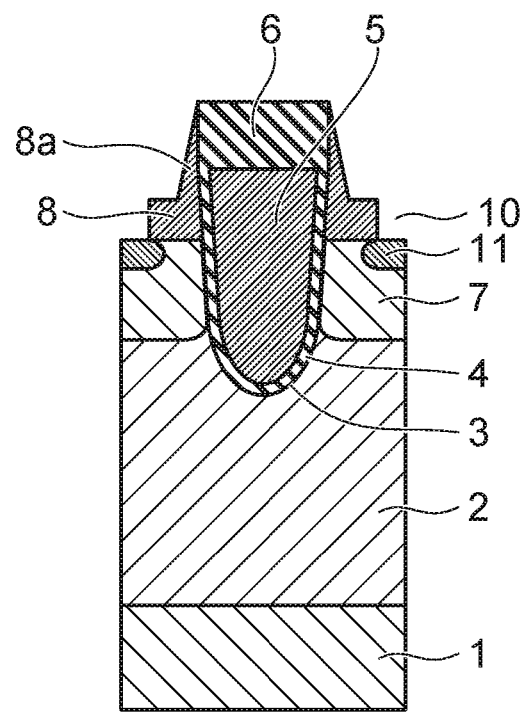
FIG. 10 is a cross-sectional view illustrating part of a manufacturing process of the semiconductor device according to the fourth embodiment.

A method for manufacturing a semiconductor device according to a fourth embodiment will now be described with reference to FIGS. 8 to 10. FIG. 8 is a flow chart of the manufacturing process based on the method according to the fourth embodiment. FIG. 9 is a sectional view of a semiconductor device manufactured by the method according to the fourth embodiment. FIG. 10 is a sectional view illustrating part of the manufacturing process based on the method according to this embodiment. The same portions as those described in the third embodiment are labeled with like reference numerals or symbols, and the description thereof is omitted. The differences from the third embodiment are described.

As shown in FIG. 8, the method for manufacturing a semiconductor device according to this embodiment further includes the step of removing the sidewall (S1250) in addition to the steps described in the third embodiment.

As shown in FIG. 9, the semiconductor device manufactured by the method according to this embodiment has a structure, in which the sidewall 9 is removed from the semiconductor device according to the third embodiment.

That is, the semiconductor device according to the embodiment includes the source electrode 12 (first electrode), and the drain electrode 13 (second electrode) facing the source electrode 12. An n-type semiconductor layer, for example, the $n^-$-type epitaxial layer 2 is provided between the source electrode 12 and the drain electrode 13. The p-type base layer 7 (second semiconductor layer) is provided between the source electrode 12 and the $n^-$-type epitaxial layer 2, and the p-type base layer 7 contacts the $n^-$-type epitaxial layer 2.

The gate electrode is provided in the p-type base layer 7. An end 5a of gate electrode 5 on the drain electrode 13 side is located in the $n^-$-type epitaxial layer 2, and another end 5b on the source electrode 12 side is provided so as to protrude from the p-type base layer 7 toward the source electrode 12. The interlayer insulating film 6 is selectively provided between the gate electrode 5 and the source electrode 13.

The $n^+$-type source layer 8 (third semiconductor layer) is provided between the p-type base layer 7 and the source electrode 12. As shown in FIG. 9, the p-type base layer, a protrusion of the gate electrode 5, the interlayer insulating film 6, and the source electrode 12 are located around the $n^+$-type source layer 8. In other words, the $n^+$-type source layer 8 is provided on the p-type base layer 7 between the source electrode 12 and the interlayer insulating film 6. The $n^+$-type source layer 8 is provided so that a width in a horizontal direction to the p-type base layer 7 decreases with approaching the source electrode 12 along a side surface 6a of the interlayer insulating film 6. Here, "horizontal" is referred to as roughly parallel to an upper surface of the p-type base layer 7 or roughly perpendicular to the side surface 6a of the interlayer insulating film 6.

The $p^+$-type contact layer 11 (fourth semiconductor layer) is provided on a side of the $n^+$-type source layer 8 opposite to the gate electrode 5. The $p^+$-type contact layer 11 is adjacent to the $n^+$-type source layer 8 and provided between the p-type base layer 7 and the source electrode 12.

The gate insulating film 4 is provided between the gate electrode 5 and each of the $n^-$-type epitaxial layer 2, the p-type base layer, and the $n^+$-type source layer 8.

The method according to this embodiment includes the steps of forming an $n^-$-type epitaxial layer on an $n^+$-type semiconductor substrate 1 (S100), forming a gate trench in the $n^-$-type epitaxial layer (S200), forming a gate insulating film on the lateral wall of the gate trench (S300), forming a gate polysilicon on the $n^-$-type epitaxial layer (S400), etching the gate polysilicon until a recess is formed in the gate trench (S500), planarizing the recess on the opening side of the gate trench with an interlayer insulating film (S600), projecting the interlayer insulating film from the $n^-$-type epitaxial layer (S700), forming a p-type base layer (S800), forming an $n^+$-type source layer (S900), forming a sidewall on both sides of the interlayer insulating film (S1000), forming a contact trench (S1100), and forming a $p^+$-type contact layer (S1200).

Then, the sidewall (S1250) is removed as shown in FIG. 10. The sidewall 9 is removed by e.g. wet etching. However, the embodiment is not limited thereto. Dry etching may also be used as long as being isotropic etching.

Next, like the method according to the third embodiment, the step of forming electrodes (S1300) is performed.

The method for manufacturing a semiconductor device according to this embodiment also has advantages similar to those of the method according to the third embodiment. In addition, the method according to this embodiment has the following effect.

As shown in FIG. 10, the sidewall 9 is removed in the method according to this embodiment. The $n^+$-type source layer 8a (remaining portion) exists on both sides of the interlayer insulating film 6. Thus, the $n^+$-type source layer 8a prevents the gate insulating film 4 from etching, while the sidewall 9 is removed. In order to ensure the selective removal of the sidewall 9, the thickness of the interlayer insulating film 6 in the direction perpendicular to the surface of the $n^+$-type source layer 8 is made sufficiently thicker than the thickness of the sidewall 9 in the direction parallel to the surface of the $n^+$-type source layer 8.

Since the sidewall 9 is removed, the aspect ratio of the contact trench 10 becomes smaller in the method according to this embodiment than in the method according to the third embodiment. Thus, the source electrode 12 may be embedded in the contact trench 10, suppressing generation of voids and the like in the contact trench 10. Accordingly, the source electrode 12 may be favorably embedded in the contact trench. Furthermore, it may be possible to reduce contact resistance of the source electrode 12, since the contact area increases between the source electrode 12 and the $n^+$-type source layer 8.

As described above, in the embodiment, the $n^+$-type source layer 8 contacts the source electrode 12 on a whole side face thereof opposite to the gate electrode 5. This allows an area of the source contact to be enlarged and a contact resistance to be reduced. Furthermore, it may become possible to easily embed part of the source electrode 12 in the contact trench 10, and to improve adhesion between the part of the source electrode 12 and an inner surface of the contact trench 10. It may also be possible to mitigate a stress due to the part of the source electrode 12 embedded in the contact trench 10 by decreasing an aspect ratio thereof.

Next, a variation of the semiconductor device according to the embodiment will be described. For example, in the semiconductor device shown in FIG. 6, a conductive side wall 9a may be used in place of the insulative side wall 9. That is, the conductive side wall 9a is provided between the n$^+$-type source layer 8 and the source electrode 12. Thereby, the source electrode 12 is electrically connected to the whole side surface of the n$^+$-type source layer 8 opposite to the gate electrode 5. As a result, the source contact area is enlarged, and the contact resistance may be reduced.

In this example, for example, in the step of forming the sidewall on both sides of the interlayer insulating film 6 (S1000) shown in FIG. 7A and FIG. 7B, the conductive film 91 is used in place of the insulating film 9. The conductive film 91 is, for example, a polysilicon film doped with n-type impurities. Thereby, the conductive side walls 9a are formed on both sides of the interlayer insulating film 6.

(Fifth Embodiment)

Figure 11:
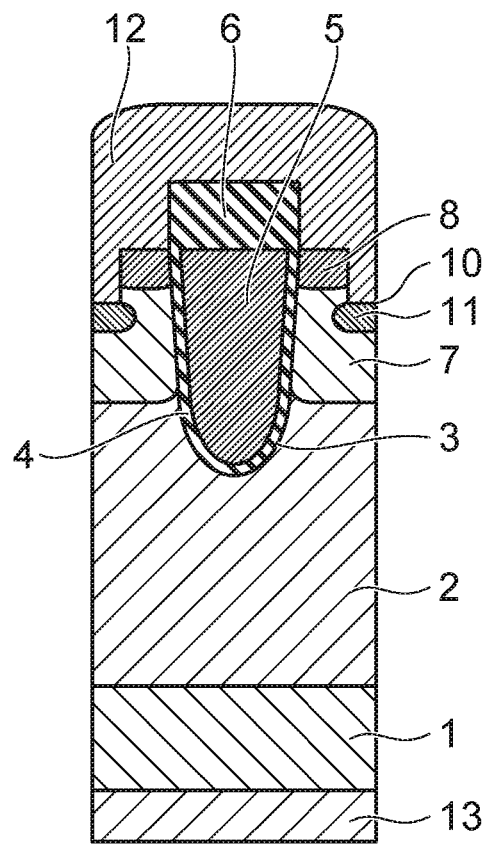
FIG. 11 is a cross-sectional view of a semiconductor device manufactured by a method according to a fifth embodiment.
Figure 12:
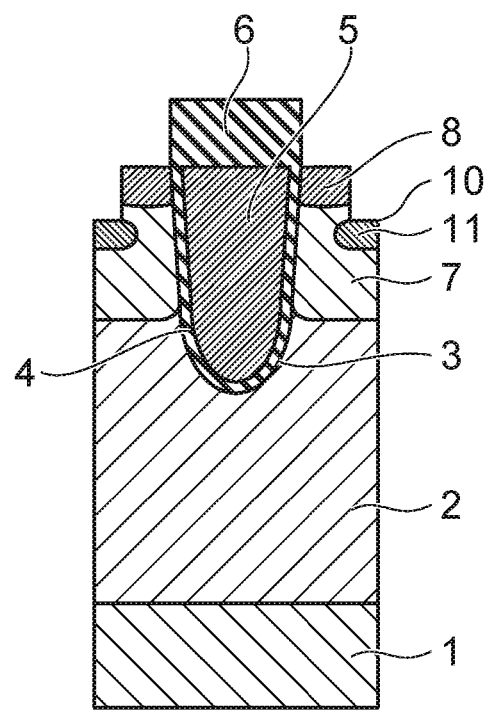
FIG. 12 is a cross-sectional view illustrating part of a manufacturing process of the semiconductor device according to the fifth embodiment.

A method for manufacturing a semiconductor device according to a fifth embodiment will now be described with reference to FIGS. 11 and 12. FIG. 11 is a cross-sectional view of a semiconductor device manufactured by the method according to the fifth embodiment. FIG. 12 is a cross-sectional view illustrating part of the manufacturing process based on the method according to this embodiment. The same portions as those described in the second or fourth embodiment are labeled with like reference numerals or symbols, and the description thereof is omitted. The differences from the second or fourth embodiment are described.

The method according to this embodiment has the same flow chart of the manufacturing process as the method according to the fourth embodiment shown in FIG. 8. As shown in FIG. 11, the n$^+$-type source layer 8a (remaining portion) does not exist on both sides of the interlayer insulating film 6 in the semiconductor device manufactured by the method according to this embodiment. In this point, the semiconductor device manufactured by the method according to this embodiment is different from the semiconductor device manufactured by the method according to the fourth embodiment. Furthermore, the method for manufacturing a semiconductor device according to this embodiment includes the step of removing the sidewall in addition to the steps described in the method according to the second embodiment.

As shown in FIGS. 3A to 3F and FIGS. 5A to 5F, the method according to this embodiment also includes the steps of forming an n$^-$-type epitaxial layer on an n$^+$-type semiconductor substrate (S100), forming a gate trench in the n$^-$-type epitaxial layer (S200), forming a gate insulating film on the lateral wall of the gate trench (S300), forming a gate polysilicon on the n$^-$-type epitaxial layer (S400), etching the gate polysilicon until a recess is formed in the gate trench (S500), planarizing the recess on the opening side of the gate trench with an interlayer insulating film (S600), projecting the interlayer insulating film from the n$^-$-type epitaxial layer (S700), forming a p-type base layer (S800), forming an n$^+$-type source layer (S900), forming a sidewall 9 on both sides of the interlayer insulating film (S1000), forming a contact trench (S1100), and forming a p$^+$-type contact layer (S1200).

Through the above steps, the n$^+$-type source layer 8a (remaining portion) is removed from both sides of the interlayer insulating film 6 in the step of projecting the interlayer insulating film from the n$^-$-type epitaxial layer (S700).

Next, like the method according to the fourth embodiment, the step of removing the sidewall 9 (S1250) is performed. The sidewalls 9 are removed by e.g. wet etching. However, the embodiment is not limited thereto. Dry etching can also be used as long as being isotropic etching. Here, in order to ensure the selective removal of the sidewall 9, the sidewall 9 is preferably made of a different material from the interlayer insulating film 6, which has faster etching rate than the interlayer insulating film 6. When using the same materials, the sidewall 9 is preferably subjected to a heat treatment different in temperature from that for the interlayer insulating film 6 so that the etching rate becomes faster than that for the interlayer insulating film 6. Alternatively, the thickness of the interlayer insulating film 6 in the direction perpendicular to the surface of the n$^+$-type source layer 8 is made sufficiently thicker than the thickness of the sidewall 9 in the direction parallel to the surface of the n$^+$-type source layer 8.

Furthermore, the upper surface of the gate polysilicon preferably locates at a position deeper than the upper surface of the n$^-$-type epitaxial layer after the step of etching the gate polysilicon (S500)

Next, like the method according to the second or fourth embodiment, the step of forming electrodes (S1300) is performed.

Also in the method for manufacturing a semiconductor device according to this embodiment, the sidewalls 9 formed on both sides of the interlayer insulating film 6 are used as the mask for forming a contact trench 10. As described above, the sidewalls 9 are formed on both sides of the interlayer insulating film 6 in a self-aligned manner. Thus, the dimensional variation is smaller than that in mask alignment. Accordingly, also in this embodiment, a semiconductor device may be manufactured under suppressing influence of the dimensional variation exerted on the on-resistance.

Furthermore, since the sidewall 9 is removed, the aspect ratio of the contact trench 10 is smaller in the method according to this embodiment than in the method according to the second embodiment. Thus, the source electrode 12 may be embedded in the contact trench 10, suppressing generation of voids and the like in the contact trench 10. Accordingly, the source electrode 12 can be favorably embedded in the contact trench. Furthermore, it is possible to reduce contact resistance of the source electrode 12, since the contact area increases between the source electrode 12 and the n$^+$-type source layer 8.

(Sixth Embodiment)

Figure 13:
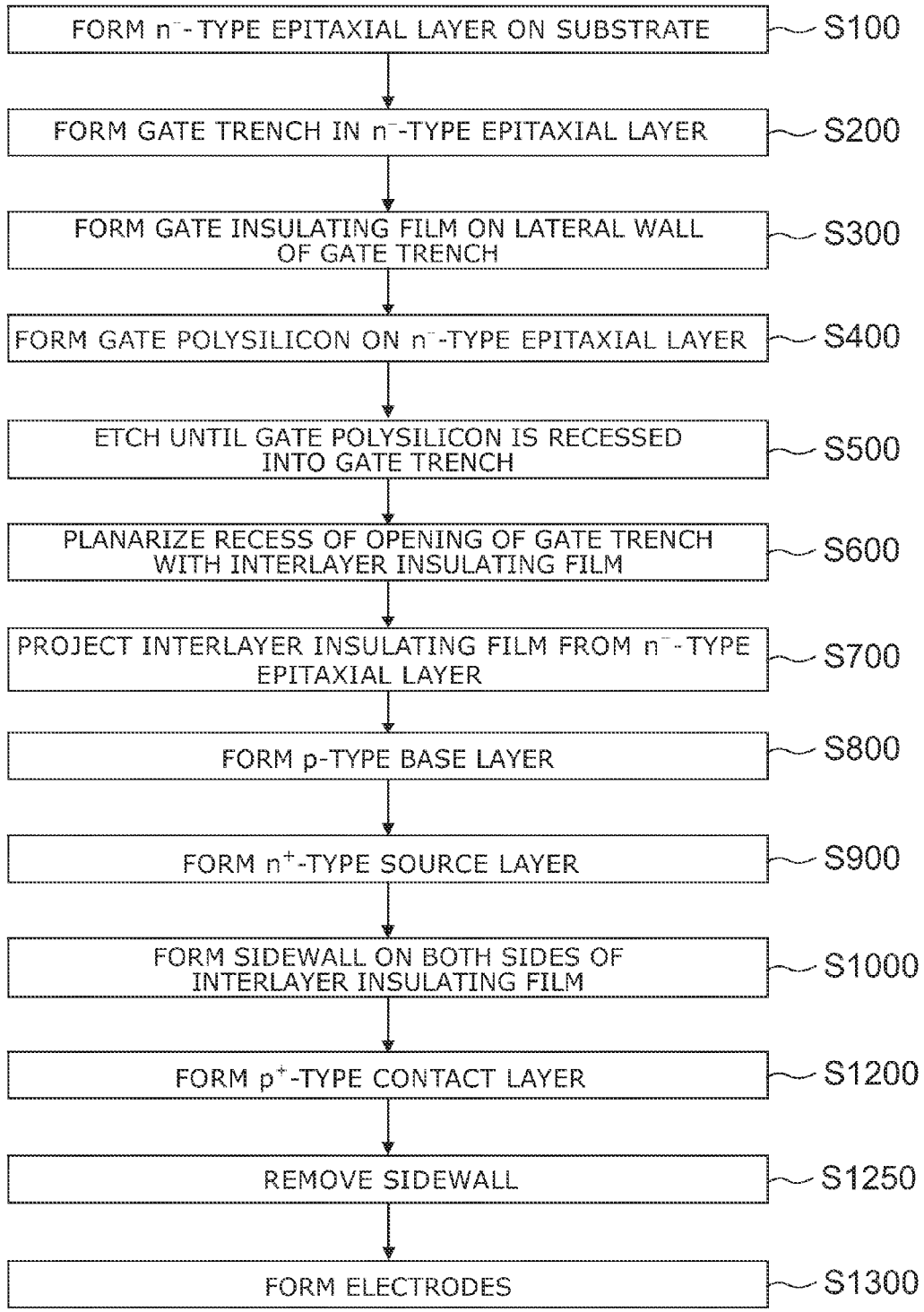
FIG. 13 is a flow chart of a manufacturing process of a semiconductor device based on a method according to a sixth embodiment.
Figure 14:
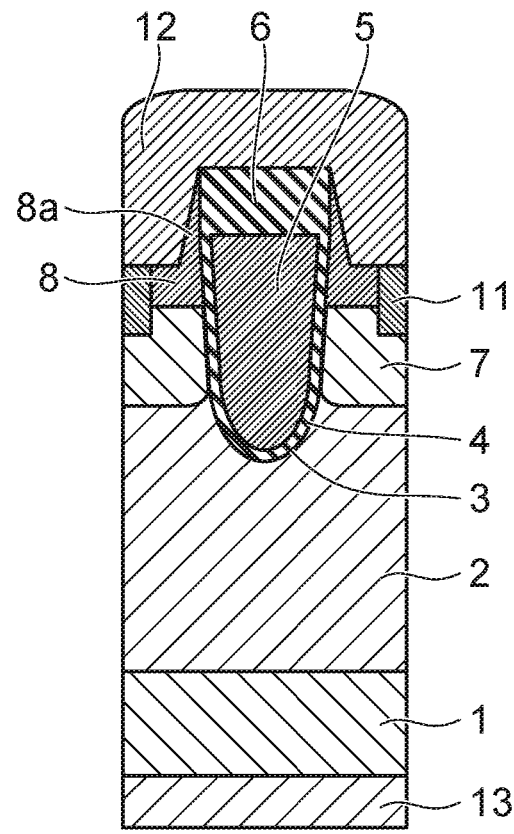
FIG. 14 is a cross-sectional view of the semiconductor device manufactured by the method according to the sixth embodiment.
Figure 15:
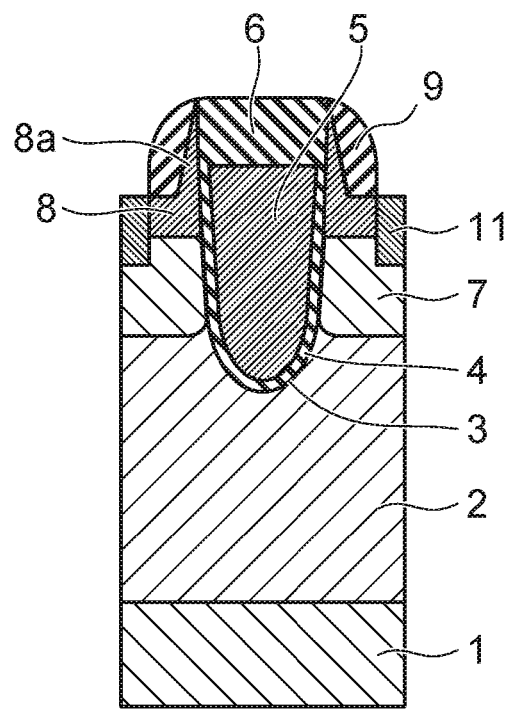
FIGS. 15 and 16 are cross-sectional views illustrating part of a manufacturing process of the semiconductor device according to the sixth embodiment.
Figure 16:
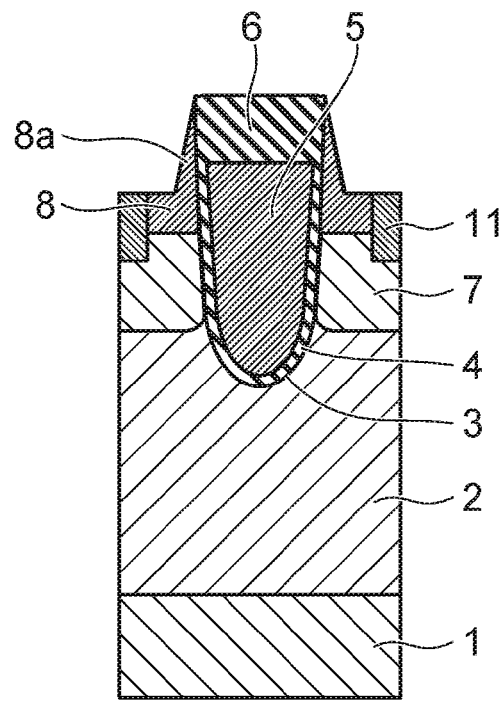

A method for manufacturing a semiconductor device according to a sixth embodiment will now be described with reference to FIGS. 13 to 16. FIG. 13 is a flow chart of the manufacturing process based on the method according to this embodiment. FIG. 14 is a cross-sectional view of a semiconductor device manufactured by the method according to this embodiment. FIGS. 15 and 16 are cross-sectional views illustrating part of the manufacturing process based on the method according to this embodiment. The same portions as those described in the fourth embodiment are labeled with like reference numerals or symbols, and the description thereof is omitted. The differences from the fourth embodiment are described.

As shown in FIG. 13, the method for manufacturing a semiconductor device according to this embodiment is different from the method according to the fourth embodiment in not including the step of forming a contact trench (S1100). That is, as shown in FIG. 14, the semiconductor device manufactured by the method according to this embodiment includes a p$^+$-type contact layer 11 penetrating from the surface of the n$^+$-type source layer 8 through the n$^+$-type source layer 8 to the p-type base layer 7 and electrically connected to the p-type base layer 7. Whereas, in the first to fifth embodiments, the p$^+$-type contact layer 11 is formed in the p-type base layer 7 so as to be adjacent to the bottom of the trench formed in the n$^+$-type source layer 8, the p$^+$-type contact layer 11 is formed so as to penetrate through the n+-type source layer 8 into the p-type base layer 7 in this embodiment.

Like the method according to the fourth embodiment, as shown in FIGS. 3A to 3F, FIGS. 4A to 4C, and FIGS. 7A to 7B, the method according to this embodiment includes the steps of forming an n−-type epitaxial layer on an n+-type semiconductor substrate (S100), forming a gate trench in the n−-type epitaxial layer (S200), forming a gate insulating film on the lateral wall of the gate trench (S300), forming a gate polysilicon on the n−-type epitaxial layer (S400), etching the gate polysilicon until a recess is formed in the gate trench (S500), planarizing the recess on the opening side of the gate trench with an interlayer insulating film (S600), projecting the interlayer insulating film from the n−-type epitaxial layer (S700), forming a p-type base layer (S800), forming an n+-type source layer (S900), and forming a sidewall on both sides of the interlayer insulating film (S1000).

Next, as shown in FIG. 15, the step of forming a p+-type contact layer (S1200) is performed. For instance, the p+-type contact layer 11 may be formed as follows. P-type impurities are ion implanted into the n+-type source layer 8 using the sidewall 9 and the interlayer insulating film 6 as a mask. Then, the p-type impurity is diffused by heat treatment. Thus, the p+-type contact layer 11 is formed in the n+-type source layer 8. It may be possible to form a p+-type contact layer 11 including a plurality of p+-type layers formed in the n+-type source layer 8. In this case, each of the p+-type layers is formed having different depth from each other by changing the acceleration voltage in the ion implantation of p-type impurity, and the p-type impurities in each p+-type layer are diffused by heat treatment. Thus, the p+-type contact layer 11 may be composed of a plurality of p-type impurity diffusion layers. Thus, a p+-type contact layer 11 is formed penetrating from the surface of the n+-type source layer 8 through the n+-type source layer 8 to the p-type base layer 7 and electrically connected to the p-type base layer 7.

Next, as shown in FIG. 16, the step of removing the sidewall (S1250) is performed. The sidewall 9 is removed by e.g. wet etching. However, the embodiment is not limited thereto. Dry etching may also be used as long as being isotropic etching.

Next, like the method for manufacturing a semiconductor device according to the fourth embodiment, the step of forming electrodes (S1300) is performed. Thus, the semiconductor device shown in FIG. 14 is obtained.

Also in the method according to this embodiment, like the method for manufacturing a semiconductor device according to the first embodiment, the sidewall 9 formed on both sides of the interlayer insulating film 6 is used as a mask for forming a p+-type contact layer 11. The sidewall is formed on both sides of the interlayer insulating film 6 in a self-aligned manner. Thus, the dimensional variation is smaller than that in mask alignment. Accordingly, a semiconductor device may be manufactured under suppressing influence of the dimensional variation exerted on the on-resistance.

Furthermore, since the sidewall is removed in the method according to this embodiment, the aspect ratio of the contact trench 10 becomes small. Thus, the source electrode 12 is embedded in the contact trench, suppressing generation of voids and the like in the contact trench 10. It may be possible to reduce contact resistance of the source electrode 12, since the contact area increases between the source electrode 12 and the n+-type source layer 8.

Furthermore, in the method for manufacturing a semiconductor device according to this embodiment, the p+-type contact layer 11 is not formed at the bottom of the contact trench 10 formed in the n+-type source layer 8 by using the sidewall 9 as a mask. Instead, the p+-type contact layer 11 is formed by the ion implantation of p-type impurity into the n+-type source layer 8 directly from the surface of the n+-type source layer 8 using the sidewall as a mask. This may reduce the steps of the manufacturing process and the production cost.

The method according to this embodiment is different from the method according to the fourth embodiment in omitting the step of forming a contact trench (S1100). Furthermore, in the step of forming a p+-type contact layer (S1200), the p+-type contact layer 11 is formed directly in the n+-type source layer 8. Similarly, the step of forming a contact trench (S1100) may be omitted in the method according to the fifth embodiment. Furthermore, the p+-type contact layer 11 may be formed directly in the n+-type source layer 8 in the step of forming a p+-type contact layer (S1200).

(Seventh Embodiment)

Figure 17:
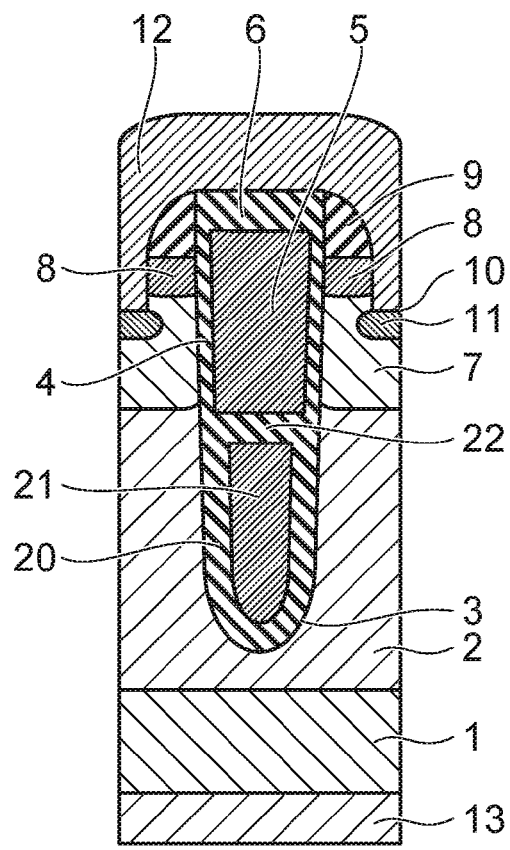
FIG. 17 is a cross-sectional view of a semiconductor device manufactured by a method according to a seventh embodiment.
Figure 18:
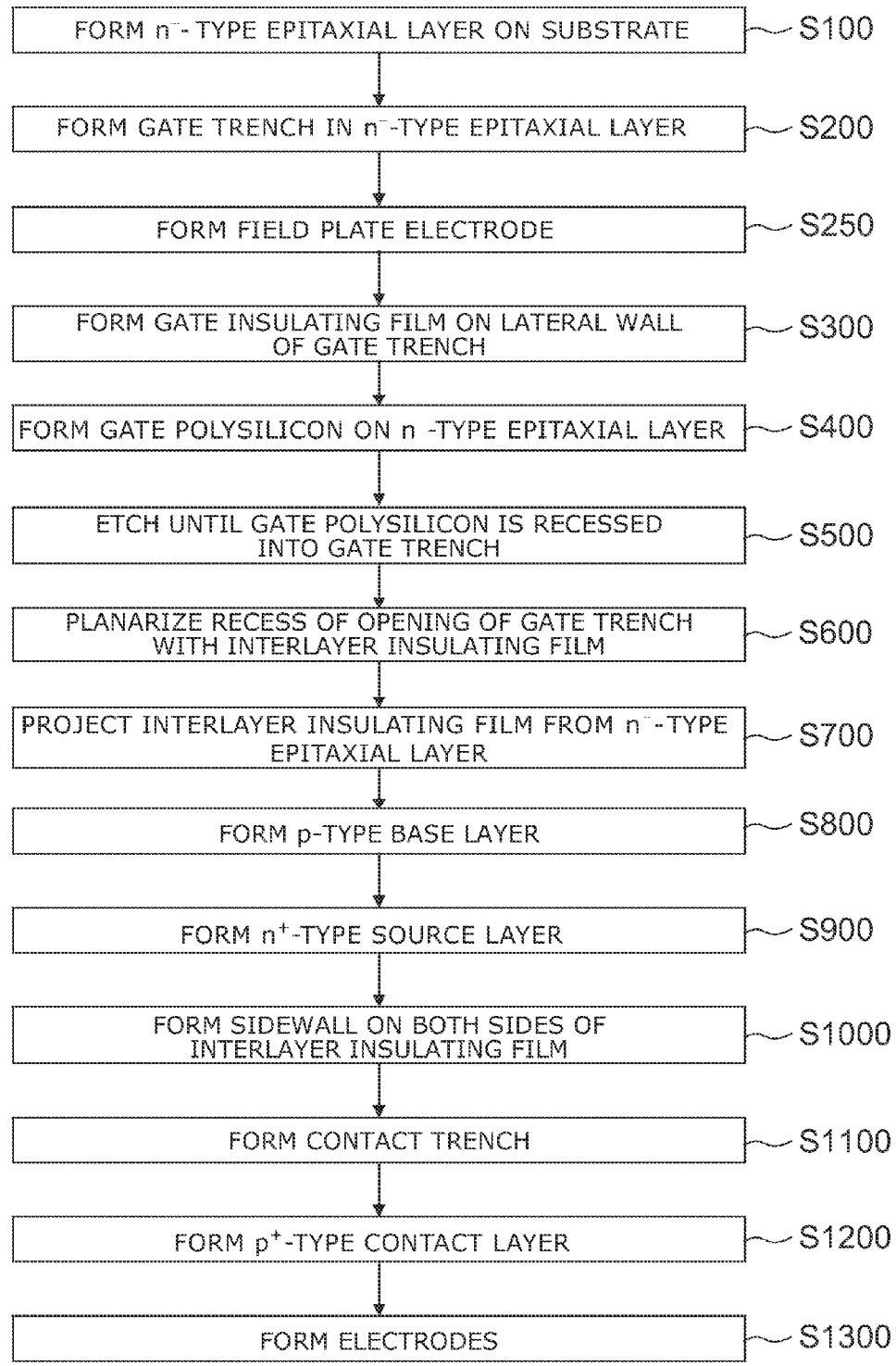
FIG. 18 is a flow chart of a manufacturing process of the semiconductor device based on the method according to the seventh embodiment.
Figure 19:
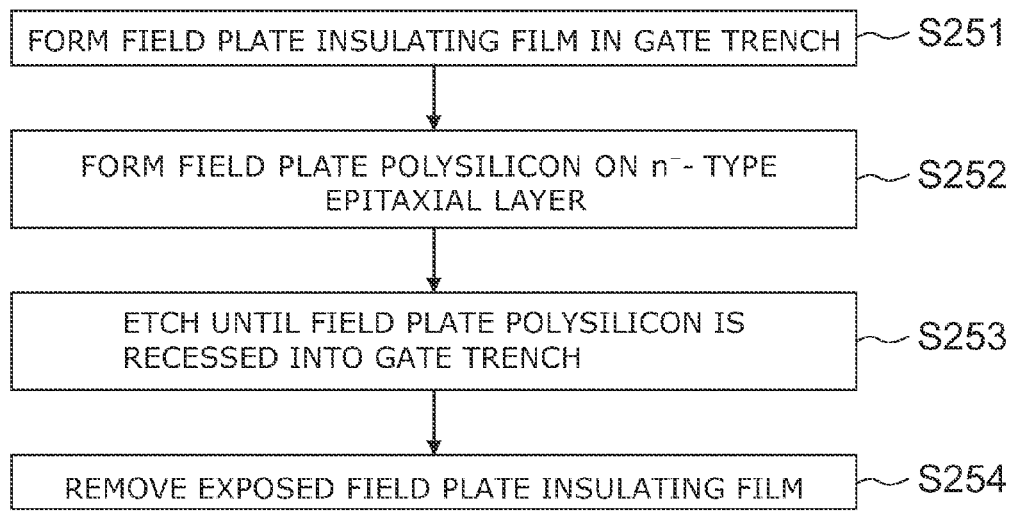
FIG. 19 is a flow chart showing part of the manufacturing process of the semiconductor device based on the method according to the seventh embodiment.

A method for manufacturing a semiconductor device according to a seventh embodiment will now be described with reference to FIGS. 17 to 22. FIG. 17 is a cross-sectional view of the semiconductor device manufactured by the method according to the seventh embodiment. FIG. 18 is a flow chart of the manufacturing process based on the method according to this embodiment. FIG. 19 is a flow chart specifically describing the step of forming a field plate electrode (S250) in FIG. 18. FIGS. 20A to 20F, FIGS. 21A to 21F, and FIGS. 22A to 22C are sectional views illustrating part of the manufacturing process based on the method according to this embodiment. The same portions as those described in the first embodiment are labeled with like reference numerals or symbols, and the description thereof is omitted. The differences from the first embodiment are described.

As shown in FIG. 17, the semiconductor device manufactured by the method according to this embodiment further includes a field plate electrode 21 below the gate electrode 5 in the gate trench 3. The field plate electrode 21 is made of conductive polysilicon. The field plate electrode 21 is provided in the gate trench 3 via a field plate insulating film 20. An interelectrode insulating film insulates the field plate electrode 21 from the gate electrode 5. The field plate insulating film 20 (a second portion) and the interelectrode insulating film 22 (a third portion) are thicker than the gate insulating film 4 (a first portion). The upper end of the field plate electrode 21 is located on the n+-type semiconductor substrate 1 side from a level of the bottom of the p-type base layer 7.

As shown in FIG. 18, the method according to this embodiment further includes the step of forming a field plate electrode (S250) in addition to the method according to the first embodiment. As shown in FIG. 19, the step of forming a field plate electrode (S250) includes the sub-steps of forming a field plate insulating film in the gate trench 3 (S251), forming a field plate polysilicon on the n−-type epitaxial layer (S252), etching the field plate polysilicon until the field plate polysilicon is recessed into the gate trench (S253), and removing the exposed field plate insulating film (S254). Here, the field plate polysilicon refers to conductive polysilicon formed in the gate trench, and serves as a field plate electrode.

In the following, a process for manufacturing a semiconductor device based on the method according to this embodiment is described with reference to FIGS. 20A to 22C.

Figure 20A:
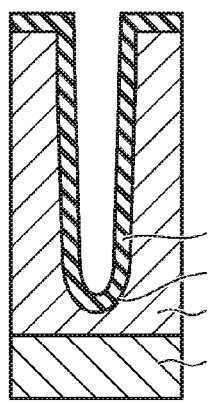

Like the method according to the first embodiment, the steps of forming an n−-type epitaxial layer on an n+-type semiconductor substrate (S100) and forming a gate trench in the n−-type epitaxial layer (S200) are performed. Then, the step of forming a field plate insulating film in the gate trench 3 (S251) is performed as shown in FIG. 20A. A field plate insulating film 20 is formed on the inner surface of the gate trench 3 and on the surface of the n−-type epitaxial layer 2.

The field plate insulating film 20 is made of e.g. silicon oxide. Alternatively, the field plate insulating film 20 may be made of silicon nitride, silicon oxynitride, or other insulator materials.

Figure 20B:
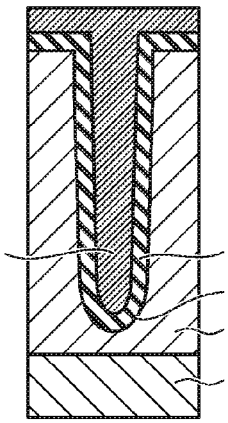

Next, as shown in FIG. 20B, a field plate polysilicon is formed on the n⁻-type epitaxial layer 2 (S252). The field plate polysilicon 21 is formed on the n⁻-type epitaxial layer 2 so as to be embedded in the gate trench 3 via the field plate insulating film 20.

Figure 20C:
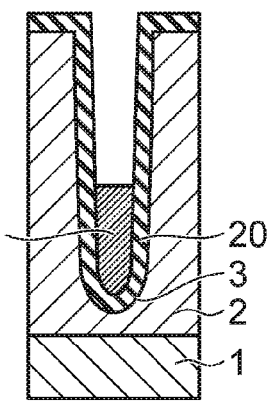

Next, as shown in FIG. 20C, the field plate polysilicon is etched until a recess is formed in the gate trench 3 (S253). For instance, the upper portion of the field plate polysilicon in the gate trench 3 is removed by etching based on RIE. A recess is formed in the upper portion of the field plate polysilicon 21 in the gate trench 3. Furthermore, in the portion not shown, part of the field plate polysilicon 21 is extracted from the gate trench 3 via the field plate insulating film onto the surface of the n⁻-type epitaxial layer 2 and electrically connected to the source electrode 12 described later. Thus, a field plate electrode 21 is formed on the lower side in the gate trench 3.

The field plate electrode 21 is electrically connected to the source electrode 12, and operates with a source potential. Alternatively, the field plate electrode 21 may be electrically connected to the gate electrode 5.

Figure 20D:
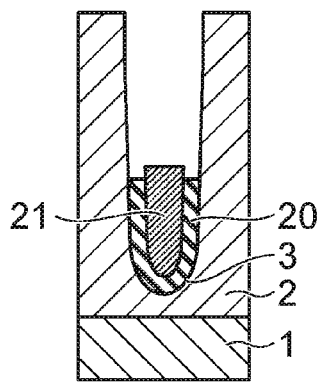

Next, as shown in FIG. 20D, the step of removing the exposed field plate insulating film (S254) is performed. The field plate insulating film 20 on the surface of the n⁻-type epitaxial layer 2 and the field plate insulating film 20 extending from the field plate electrode 21 side in the gate trench 3 are removed by e.g. wet etching.

Figure 20E:
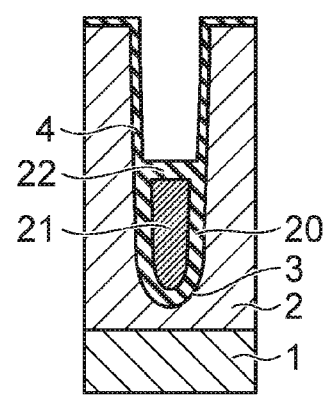

Next, as shown in FIG. 20E, the step of forming a gate insulating film on the internal wall of the gate trench (S300) is performed. A gate insulating film 4 is formed by e.g. thermally oxidizing the surface of the n⁻-type epitaxial layer 2 and the internal wall of the gate trench 3 extending from the field plate electrode 21 side. Simultaneously, an interelectrode insulating film 22 is formed on the exposed portion of the field plate electrode 21 in the gate trench 3. The gate insulating film 4 and the interelectrode insulating film 22 may also be a film of silicon oxide, or other insulators such as silicon nitride and silicon oxynitride, formed using CVD technique.

Subsequently, like the method according to the first embodiment, the steps of forming a gate polysilicon 5 on the n⁻-type epitaxial layer (S400), etching the gate polysilicon until a recess is formed in the gate trench (S500), planarizing the recess on the opening side of the gate trench with an interlayer insulating film (S600), projecting the interlayer insulating film from the n⁻-type epitaxial layer (S700), forming a p-type base layer (S800), forming an n⁺-type source layer (S900), forming a sidewall on both sides of the interlayer insulating film (S1000), forming a contact trench (S1100), forming a p⁺-type contact layer (S1200), and forming electrodes (S1300) are performed. These steps are sequentially described below.

Figure 20F:
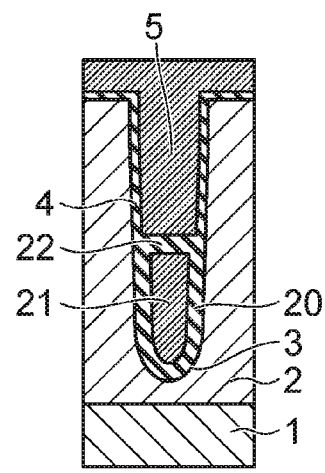

As shown in FIG. 20F, the step of forming a gate polysilicon on the n⁻-type epitaxial layer 2 (S400) is performed. A gate polysilicon 5 is formed on the n⁻-type epitaxial layer 2 so as to be embedded in the gate trench 3 via the gate insulating film 4 by e.g. CVD technique.

Next, as shown in FIG. 21A, the gate polysilicon is etched until a recess is formed in the gate trench (S500). The gate polysilicon 5 formed on the n⁻-type epitaxial layer 2 is etched using RIE. Thus, the gate polysilicon on the surface of the n⁻-type epitaxial layer 2 is removed so that the gate polysilicon 5 is recessed into the gate trench 3. That is, the gate polysilicon 5 is etched so that the gate polysilicon 5 remains in the gate trench 3 on the n⁺-type semiconductor substrate 1 side from the surface of the n⁻-type epitaxial layer 2. Thus, a gate electrode 5 made of the gate polysilicon is formed on the field plate electrode 21 via the interelectrode insulating film 22 in the gate trench 3.

Next, as shown in FIGS. 21B and 21C, the recess on the opening side of the gate trench is planarized with an interlayer insulating film (S600). An interlayer insulating film 6 is formed using e.g. CVD technique on the n⁻-type epitaxial layer 2 so as to fill the gate trench 3. The interlayer insulating film 6 is made of e.g. silicon oxide. Instead of silicon oxide, silicon nitride or silicon oxynitride may also be used for the interlayer insulating film 6. The interlayer insulating film 6 is etched using RIE until part of the n⁻-type epitaxial layer 2 is exposed. As a result, the interlayer insulating film 6 is embedded in the recess on the gate electrode 5 provided in the gate trench 3. The recess on the opening side of the gate trench 3 is planarized with the interlayer insulating film 6.

Next, as shown in FIG. 21D, the step of projecting the interlayer insulating film 6 from the n⁻-type epitaxial layer 2 (S700) is performed. The n⁻-type epitaxial layer 2 is etched using RIE. Thus, the surface of the n⁻-type epitaxial layer 2 is set back to the position of e.g. the upper end of the gate electrode 5. At this time, the etching condition of RIE may be adjusted so that the n⁻-type epitaxial layer 2 remains without being etched away in the portion adjacent to the interlayer insulating film 6. As a result, a remaining portions 2a of the n⁻-type epitaxial layer 2 having a tapered shape are formed on both sides of the interlayer insulating film 6. This etching may be performed also using CDE (chemical dry etching).

Next, as shown in FIG. 21E, a p-type base layer is formed using ion implantation technique (S800). P-type impurities are implanted from the surface of the n⁻-type epitaxial layer 2 and the surface of the remaining portion 2a into the n⁻-type epitaxial layer 2. Then, the p-type impurities are diffused and activated by heat treatment in the n⁻-type epitaxial layer 2. As a result, a p-type base layer 7 is formed on the n⁻-type epitaxial layer 2 and adjacent to the gate insulating film 4. The diffusion of the p-type impurity is controlled so that the bottom of the p-type base layer 7 does not extend beyond the lower end level of the gate electrode 5 on the n⁺-type semiconductor substrate 1 side. The remaining portion 2a of the n⁻-type epitaxial layer similarly turns to a p-type base layer 7a.

Next, as shown in FIG. 21F, an n⁺-type source layer is formed using ion implantation technique (S900). N-type impurities are implanted from the surface of the p-type base layer 7 and the surface of the remaining portion p-type base layer 7a into the p-type base layer. Then, the n-type impurities are diffused and activated by heat treatment in the p-type base layer 7. As a result, an n⁺-type source layer 8 is formed on the p-type base layer 7, and adjacent to the gate insulating film 4. The p-type base layer 7a similarly turns to an n⁺-type source layer 8a.

Figure 22A:
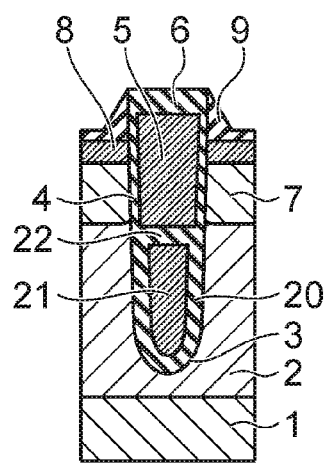
Figure 22B:
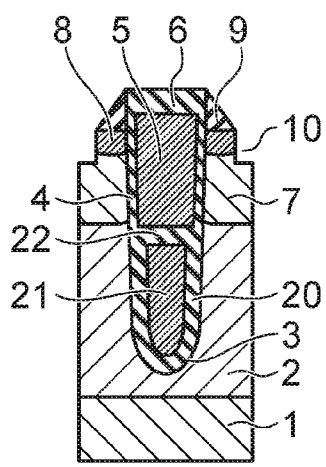

Next, as shown in FIGS. 22A and 22B, sidewalls 9 are formed on both sides of the interlayer insulating film 6 (S1000). Thermally oxidizing the n⁺-type source layer 8 and the n⁺-type source layer 8a (remaining portion) forms an insulating film 9 of silicon oxide extending from the interlayer insulating film 6 and covering the surface of the n⁺-type source layer 8. A portion of the insulating film 9 formed from the n⁺-type source layer 8a is thicker in the direction perpendicular to the surface of the n⁺-type source layer 8 than a portion of the insulating film 9 formed on the surface of the n⁺-type source layer 8. Then, the insulating film 9 is etched using RIE until part of the n⁺-type source layer 8 is exposed. Thus, the portion of the insulating film 9 formed from the n+-type source layer 8a remains as a sidewall 9. As a result, the sidewall 9 is formed on both sides of the interlayer insulating film 6.

Next, as shown in FIG. 22B, a contact trench is formed using RIE (S1100). The exposed surface of the n+-type source layer 8 is etched using this sidewall 9 as a mask. Thus, a contact trench 10 is formed in the n+-type source layer 8. When the bottom of the contact trench 10 reaches the p-type base layer 7, etching is stopped. As a result, the contact trench 10 is formed along the sidewall 9. The internal wall of the contact trench 10 includes the n+-type source layer 8, and the bottom is a surface of the p-type base layer 7.

Figure 22C:
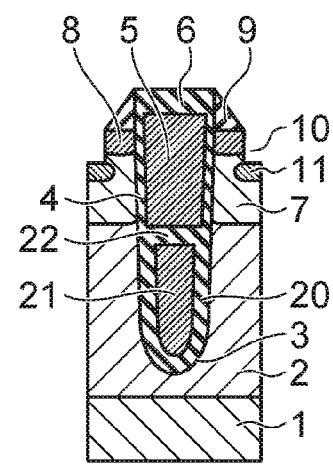

Next, as shown in FIG. 22C, a p+-type contact layer is formed in the bottom of the contact trench 10 (S1200). P-type impurities are ion implanted into the p-type semiconductor layer exposed at the bottom of the contact trench 10 using the sidewall 9 as a mask. Then, the p-type impurity is diffused and activated by heat treatment in the p-type base layer 7. Thus, a p+-type contact layer 11 is formed in the p-type base layer 7 so as to be adjacent to the bottom of the contact trench 10.

Next, the step of forming electrodes (S1300) is performed to complete the device as shown in FIG. 17. A source electrode 12 is formed so as to fill the contact trench 10 and to cover the interlayer insulating film 6 and the sidewall 9. The source electrode 12 is electrically connected to the n+-type source layer 8 at the internal wall of the contact trench 10, and electrically connected to the p+-type contact layer 11 at the bottom of the contact trench 10. The source electrode 12 may have e.g. a stacked structure of Ti/TiN/W/Al formed in this order. Thus, the source electrode 12 can favorably fill the contact trench 10. A drain electrode 13 is formed on the n+-type semiconductor substrate 1 on the side opposite to the n−-type epitaxial layer 2. Thus, the drain electrode 13 is electrically connected to the n+-type semiconductor substrate 1.

The method for manufacturing a trench type semiconductor device according to this embodiment also achieves advantages similar to those of the method according to the first embodiment.

The method according to this embodiment further includes the step of forming a field plate electrode (S250) between the steps of forming a gate trench in the n−-type epitaxial layer (S200) and forming a gate insulating film on the internal wall of the gate trench (S300) in the method according to the first embodiment. Similarly, the manufacturing process may also include the step of forming a field plate electrode (S250) between the steps of forming a gate trench in the n−-type epitaxial layer (S200) and forming a gate insulating film on the internal wall of the gate trench 3 (S300) in the methods according to the second to sixth embodiments.

In the method for manufacturing a semiconductor device according to the embodiments described above, the sidewall 9 is made of an insulating film. However, in the embodiments except the first embodiment, the sidewall 9 is not limited to an insulating film. For example, a semiconductor formed by CVD technique and the like can also be used for the sidewall. Alternatively, semi-insulating silicon, conductive polysilicon or other conductive films may also be used for the sidewall.

In the semiconductor device manufactured by the method according to the second, third, and seventh embodiments, the sidewall 9 may be made of n-type polysilicon. Then, the source electrode 12 is electrically connected to the n+-type source layer 8 also via the sidewall 9. Thus, when the sidewall 9 is a conductive film of polysilicon or the like, the source contact resistance is further reduced, comparing with the case where the sidewall 9 is an insulating film. As a result, the on-resistance of the semiconductor device is further reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a second electrode facing the first electrode;
a first semiconductor layer of a first conductivity type, the first semiconductor layer being provided between the first electrode and the second electrode;
a second semiconductor layer of a second conductivity type, the second semiconductor layer being provided between the first electrode and the first semiconductor layer;
a gate electrode provided in the second semiconductor layer, an end of the gate electrode on a side of the second electrode being located in the first semiconductor layer, another end of the gate electrode on a side of the first electrode protruding from the second semiconductor layer toward the first electrode;
a first insulating film provided between the gate electrode and the first electrode;
a third semiconductor layer of the first conductivity type, the third semiconductor layer being provided on the second semiconductor layer; and
a second insulating film provided between the gate electrode and each of the first semiconductor layer, the second semiconductor layer and a part of the third semiconductor layer, wherein
the third semiconductor layer extends along the second insulating film and the first insulating film in a first direction toward the first electrode from the second electrode, and a width of the third semiconductor layer decreases along the first direction.

2. The device according to claim 1, further comprising a side wall provided between the third semiconductor layer and the first electrode.

3. The device according to claim 2, wherein the side wall is conductive.

4. The device according to claim 1, further comprising a fourth semiconductor layer of the second conductivity type provided between the second semiconductor layer and the first electrode, the fourth semiconductor layer being adjacent to the third semiconductor layer.

5. The device according to claim 4, wherein the fourth semiconductor layer is provided in the second semiconductor layer; an end of the fourth semiconductor layer in the first direction is located in the second semiconductor layer; and another end of the fourth semiconductor layer in the first direction contacts the first electrode.

6. The device according to claim 1, further comprising a field plate electrode provided in the first semiconductor layer between the gate electrode and the second electrode,
wherein the second insulating film includes a first portion provided between the gate electrode and the second semiconductor layer, and a second portion provided between the field plate electrode and the first semiconductor layer; and the second portion is thicker than the first portion.

7. The device according to claim 6, wherein the second insulating film further includes a third portion provided between the gate electrode and the field plate electrode.

8. The device according to claim 6, wherein the field plate electrode is electrically connected to the first electrode.

9. The device according to claim 6, wherein the field plate electrode is electrically connected to the gate electrode.

* * * * *